(12) United States Patent
Reynolds et al.

(10) Patent No.: US 7,807,758 B2
(45) Date of Patent: Oct. 5, 2010

(54) CHEMICAL DEFUNCTIONALIZATION OF POLYMERIC ALKYLENEDIOXYHETEROCYCLICS

(75) Inventors: John R. Reynolds, Gainesville, FL (US); Benjamin Dennis Reeves, Great Falls, MT (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 56 days.

(21) Appl. No.: 12/158,941

(22) PCT Filed: Jan. 25, 2007

(86) PCT No.: PCT/US2007/061016

§ 371 (c)(1),
(2), (4) Date: Oct. 14, 2008

(87) PCT Pub. No.: WO2007/087587

PCT Pub. Date: Aug. 2, 2007

(65) Prior Publication Data

US 2009/0221763 A1    Sep. 3, 2009

Related U.S. Application Data

(60) Provisional application No. 60/762,398, filed on Jan. 26, 2006.

(51) Int. Cl.
*C08G 73/02* (2006.01)

(52) U.S. Cl. ............... 525/417; 525/535; 528/360; 528/377; 528/380; 528/403; 549/29; 549/60; 549/79

(58) Field of Classification Search ............... 525/417, 525/535; 528/377, 380, 403, 360; 549/29, 549/60, 79
See application file for complete search history.

(56) References Cited

U.S. PATENT DOCUMENTS

| 4,816,536 | A* | 3/1989 | Shimizu et al. | 526/258 |
| 4,959,430 | A* | 9/1990 | Jonas et al. | 526/257 |
| 6,403,741 | B1* | 6/2002 | Heuer et al. | 526/256 |
| 2003/0139505 | A1* | 7/2003 | Reuter et al. | 524/265 |

OTHER PUBLICATIONS

Welsh, D.M.; Kumar, A.; Meijer, E.W.; Reynolds, J.R.; Advanced Materials, 1999, 11(16), p. 1379-1382.*
Reeve, B.D.; Grenier, C.R.G.; Argun, A.A.; Cirpan, A.; McCarley, T.D.; Reynolds, J.R.; Solution Processable and Electrochromic Dioxythiophene-Based Polymers, Polymer Preprints, 2004.*
Reeves, B.D.; Grenier, C.R.G.; Reynolds, J.R.; Spray Coatable Electroactive Dioxythiophene Polymers, Polymer Preprints, 2004.*
Reeves, B.D.; Grenier, C.R.G.; Argun, A.A.; Cirpan, A.; Cunningham, G.B.; .; McCarley, T.D.; Reynolds, J.R; Synthetic Methodology Toward New Propylenedioxythiophene Polymers, Polymer Preprints, 2004.*
Kloeppner, L.J.; Welsh, D.M.; Reynolds, J.R.; Symmetrically Derivatized Poly(3,4-Propylenedioxythiophene), Polymer Preprints, 1999.*
Groenendaal, L.; Jonas, F.; Frietag, D.; Pielartzik, H.; Reynolds, J.R.; Advanced Materials, 2000, 12(7), p. 481-494.*
Grenier, C.R.G.; Reeves, B.D.; Argun, A.A.; Reynolds, J.R.; Processable Dioxythiophene Based Polymers With Branched Substituents, Polymer Preprints, 2004.*
Ha, Y. et at., "Conductivity tuning of poly(3,4-ethylenedioxythiophene) through side-group cleavage," *Synthetic Metals*, Feb. 27, 2004, pp. 101-105, vol. 144.
Yu, J. et al., "Synthesis, Solid-Phase Reaction, and Patterning of Acid-Labile 3,4-Ethylenedioxythiophene-Based Conjugated Polymers," *Chemistry of Materials*, Aug. 13, 2002, pp. 3705-3714, vol. 14.

* cited by examiner

*Primary Examiner*—David Wu
*Assistant Examiner*—Robert Jones, Jr.
(74) *Attorney, Agent, or Firm*—Saliwanchik, Lloyd & Saliwanchik

(57) ABSTRACT

A method for preparing a defunctionalized alkylenedioxyheterocycle polymer or copolymer involves providing a polycarboxylic acid derivative functionalized alkylenedioxyheterocycle polymer or copolymer and transforming the polymer or copolymer into a defunctionalized alkylenedioxyheterocycle polymer or copolymer which is polyhydroxy, polythiol, polyamino, or polycarboxylic acid functionalized alkylenedioxyheterocycle polymer or copolymer. The monomers, homopolymers and copolymers for use in the method are new compositions of matter. The polymers containing polycarboxylic acid derivative functionalized alkylenedioxyheterocycle units are soluble polymers which are defunctionalized to yield insoluble polyhydroxy, polythiol, polyamino, or polycarboxylic acid functionalized alkylenedioxyheterocycle polymers. These polymers can be cast as films for use as: hole transport layers in organic light emitting diodes; active electrochrome in electrochromic windows, mirrors and displays; field effect transistors, supercapacitors, batteries, photovoltaic cells, and other electronic components; electronic paper; anti-stat conductors; and transparent conductors.

31 Claims, 11 Drawing Sheets

$^1$H NMR (300 MHz, CDCl$_3$) of (top) ProDOT(CH$_2$OC$_3$H$_6$OC(O)C$_5$H$_{11}$)$_2$ and (bottom) PProDOT(CH$_2$OC$_3$H$_6$OC(O)C$_5$H$_{11}$)$_2$.

UV-vis absorbance spectrum (left) superimposed upon the fluorescence emission spectrum (right) of a toluene solution of PProDOT(CH$_2$OC(O)C$_6$H$_{13}$)$_2$.

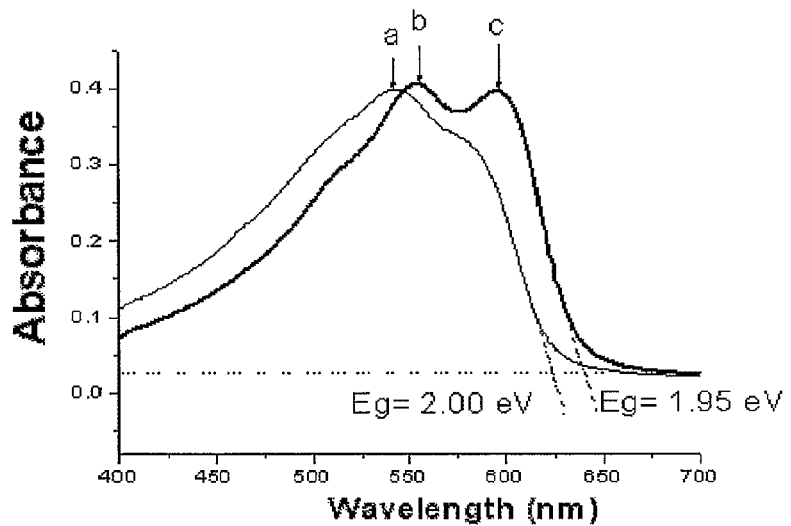

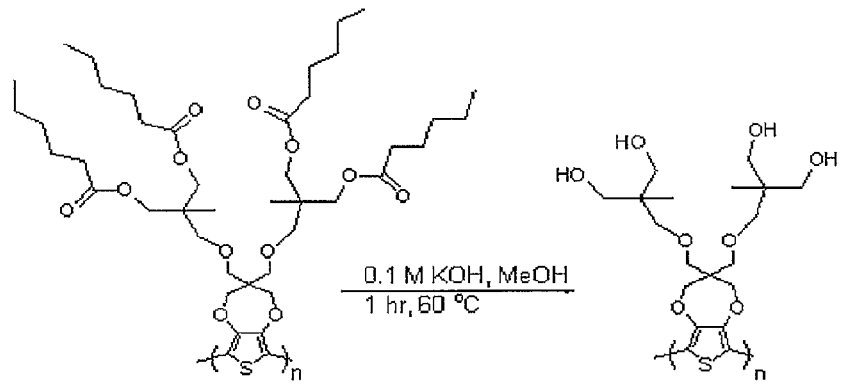

PProDOT(CH$_2$OCH$_2$C(CH$_3$)(CH$_2$OC(O)C$_5$H$_{11}$)$_2$)$_2$      PProDOT(CH$_2$OCH$_2$C(CH$_3$)(CH$_2$OH)$_2$)$_2$

UV-vis spectra of a spray cast film of ProDOT(CH$_2$OCH$_2$C(CH$_3$)(CH$_2$OC(O)C$_5$H$_{11}$)$_2$)$_2$ (thin line, a= λ$_{max}$ = 541 nm) and a film treated with 0.1 M KOH at 60 °C for 1 hr followed by cooling, washing in methanol, and vacuum drying at 50 °C for four hours to form PProDOT(CH$_2$OCH$_2$C(CH$_3$)(CH$_2$OH)$_2$)$_2$ (thick line, b= 556 nm, c= 597 nm).

*Fig. 7*

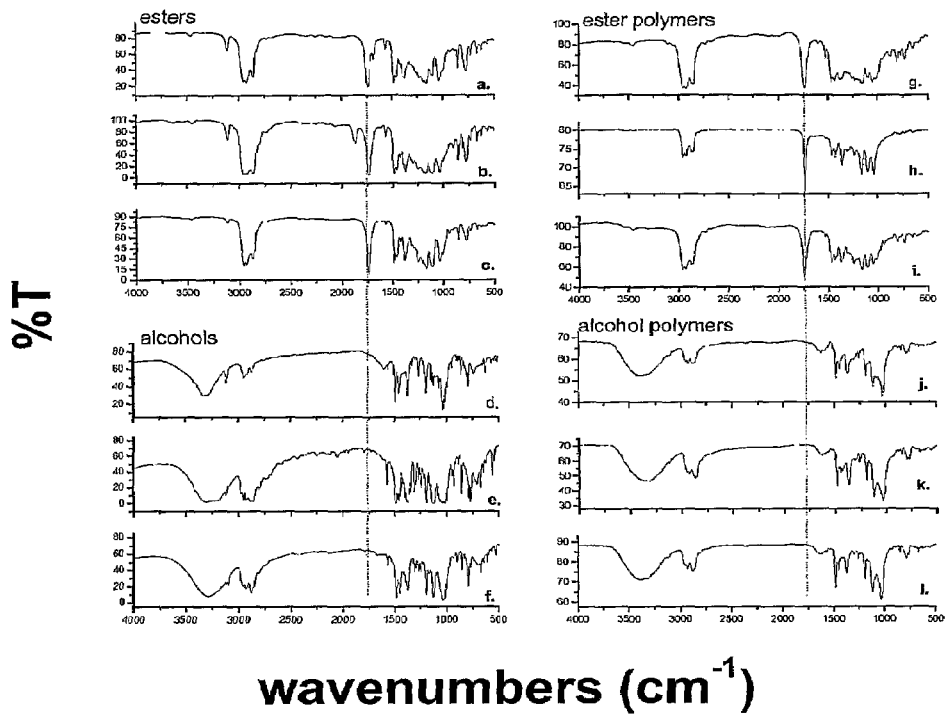

IR spectroscopy of films on KBr plates (esters) or pressed pellets (alcohols)
a.) ProDOT(CH$_2$OC(O)C$_6$H$_{13}$)$_2$, b.) ProDOT(CH$_2$OC$_3$H$_6$OC(O)C$_5$H$_{11}$)$_2$,
c.) ProDOT(CH$_2$OCH$_2$C(CH$_3$)(CH$_2$OC(O)C$_5$H$_{11}$)$_2$)$_2$, d.) ProDOT(CH$_2$OH)$_2$,
e.) ProDOT(CH$_2$OC$_3$H$_6$OH)$_2$, f.) ProDOT(CH$_2$OCH$_2$C(CH$_3$)(CH$_2$OH)$_2$)$_2$,
g.) PProDOT(CH$_2$OC(O)C$_6$H$_{13}$)$_2$, h.) PProDOT(CH$_2$OC$_3$H$_6$OC(O)C$_5$H$_{11}$)$_2$,
i.) PProDOT(CH$_2$OCH$_2$C(CH$_3$)(CH$_2$OC(O)C$_5$H$_{11}$)$_2$)$_2$, j.) PProDOT(CH$_2$OH)$_2$,
k.) PProDOT(CH$_2$OC$_3$H$_6$OH)$_2$, l.) ProDOT(CH$_2$OCH$_2$C(CH$_3$)(CH$_2$OH)$_2$)$_2$.

Fig. 8

Cyclic voltammetry (20 mV/s) superimposed on relative luminance for a film of PProDOT($CH_2OH$)$_2$ in 0.1 M TBAPF$_6$/PC.

Top: Spectroelectrochemistry of a spray cast film of PProDOT(CH$_2$OC(O)C$_6$H$_{13}$)$_2$ at potentials:
   a) -0.6, b) -0.25, c) -0.2, d) -0.15, e) -0.1, f) -0.05, g) 0.0, h) 0.05, i) 0.10, j) 0.15, k) 0.20, l) 0.25, m) 0.30, n) 0.35, o) 0.40, p) 0.45, q) 0.5 V vs Fc/Fc$^+$.

Bottom: Spectroelecctrochemisry of PProDOT(CH$_2$OH)$_2$ at potentials:
   a) -0.9, b) -0.4, c) -0.35, d) -0.30, e) -0.25, f) -0.20, g) -0.15, h) -0.10, i) -0.05, j) 0.0, k) 0.05, l) m) 0.10, n) 0.15, o) 0.20, p) 0.25, q) 0.30, r) 0.35, s) 0.40, t) 0.45, u) 0.5 V vs Fc/Fc$^+$.

(a) luminance and (b) current density and percent quantum efficiency vs voltage for ITO/PProDOT(CH$_2$OCH$_2$C(CH$_3$)(CH$_2$OH)$_2$)$_2$/MEH-PPV/Ca/Al device.

CHEMICAL DEFUNCTIONALIZATION OF POLYMERIC ALKYLENEDIOXYHETEROCYCLICS

CROSS-REFERENCE TO RELATED APPLICATIONS

This application is the U.S. national stage application of International Patent Application No. PCT/US2007/061016, filed Jan. 25, 2007, which claims the benefit of U.S. Provisional Patent Application Ser. No. 60/762,398, filed Jan. 26, 2006, the disclosures of which are incorporated by reference herein in their entirety, including any figures, tables, or drawings.

The subject invention was made with United States Government support under Air Force Office of Scientific Research Grant number F49620-03-1-009. The United States government has certain rights in the invention.

FIELD OF THE INVENTION

The invention is directed to methods of forming poly alkylenedioxyheterocyclics and resulting compositions.

BACKGROUND OF THE INVENTION

Conducting polymers have generated great interest because of their moderate mobilities and ability to change optical properties reversibly. Commercial products from conducting polymers are potentially cost effective, more easily processed, lighter in weight, and more flexible, than products fabricated from alternate material in existing technologies. A class of conducting polymers, polyheterocyclics, which include polythiophenes, polypyrroles, and polyfurans, are a well known class of conducting polymers. More specifically, the conducting polymers, poly(3,4-alkylenedioxyheterocyclics) have been extensively studied in electrochromic devices, photovoltaic devices, transparent conductors, antistatic coatings, and as the hole transport layer in light emitting diodes. The 3,4-alkylenedioxy bridge on the heterocycle allows a modified polyheterocycle where the bridge does not cause an undesirable conformational change in the backbone of the polymer and the electron donating effect of the oxygen substituents increases the HOMO of the conjugated polymer reducing its band gap.

A drawback to the processing of unsubstituted poly(3,4-alkylenedioxyheterocyclics) for example poly(3,4-ethylenedioxythiophene), or poly(3,4-alkylenedioxyheterocyclics) that have small or highly polar substituents, results from their poor solubility. However, the poor solubility is a desirable feature after processing of the conducting polymer in many of the applications of the manufactured devices containing these conducting polymers. Processing methods that render a soluble film insoluble are useful in multilayer device architectures, such as organic light emitting diodes and photovoltaic cells. The processing of poly(3,4-alkylenedioxythiophenes) has relied mostly on depositing an aqueous dispersion of the oxidized form of alkylenedioxythiophenes in the presence of polymer electrolytes, such as poly(3,4-ethylenedioxythiophene)-polystyrene sulfonate. However, the acidic nature of the polystyrene sulfonate polyelectrolyte has adverse effects on device quality.

The solubility of poly(3,4-alkylenedioxythiophenes) can be enhanced by the presence of substituents that interact with a desired solvent. For example, substitution of poly(3,4-ethylenedioxythiophene) on the ethylene bridge with long alkyl side chains solubilizes the polymer without a significant increase of the band gap relative to the unsubstituted polymer. A recent approach for processing polythiophenes is to deposit a soluble polythiophene, due to the presence of an appropriate substituent, on a device substrate followed by the rendering of the polythiophene into a insoluble state by removal of the substituent. Although this approach is inherently desirable, the manners in which it has been achieved have some drawbacks. Efficient cost effective methods of converting a soluble poly(3,4-alkylenedioxyheterocycle) to an insoluble poly(3,4-alkylenedioxyheterocycle) remain desirable to facilitate the fabrication of devices that use these conducting polymers.

Holdcroft et. al. (*Chemistry of Materials* 2002, 14, 3705) discloses substituent cleavage in copolymers of dioxythiophenes to change a soluble alternating copolymer film into an insoluble film. Tetrahydropyranyl groups are used to protect alcohol functionalities on a 11-hydroxyundecyl substituted thiophene repeating unit which alternates with a ethylenedioxythiophene repeating unit. The tetrahydropyranyl groups cleave by the use of an acid catalyst upon heating 130° C. or greater. Subsequent washing of the polymer film with chloroform removes the untreated polymer leaving the deprotected alcohol substituted polymer in place. A disadvantages of this method for many applications is the use of a copolymer where the electron rich dioxythiophene repeating unit is diluted with a thiophene repeating unit as this reduces the quality of the electrooptical properties from that of a poly (alkylenedioxythiophene) homopolymer. Another disadvantage of this method is the requirement of high temperatures that can lead to copolymer damage, decreasing the lifetime of electronic devices fabricated from this copolymer. Furthermore, the addition of an acid can effect the lifetime and quality of the electronic device.

Shashidhar et. al. (*Synthetic Metals* 2004, 144, 101.) discloses side group cleavage of a single perflourinated ester substituted poly(3,4-ethylenedioxythiophene) to increase conductivity. The polymer is synthesized by making a solution of monomer in oxidizing agent and imidazole and spin casting the solution on a substrate followed by heating the film to 110° C. Polymerization in the absence of imidazole is also disclosed where an insoluble and insulating film result upon polymerization. Subsequent immersion of the film in imidazole solution cleaves the ester side groups. Disadvantages of this method include: the use of a perfluorinated acid equivalent, which considerably raises the cost of the polymer and processing to include environmental controls; the resulting polymer can not be regular or symmetric, which can reduce the durability of a polymer relative to a regular or symmetric polymer; and the polymerization is performed on the substrate rendering the oxidized polymer directly and restricts the use of this approach from many applications where the neutral polymer rather than the conducting polymer is desired.

Hence the need remains for a method of converting a soluble poly(3,4-alkylenedioxyheterocycle) to an insoluble poly(3,4-alkylenedioxyheterocycle) where an insoluble, unoxidized regular homopolymer is needed at a reasonable cost and temperature. A desirable method would also fully remove dopants, oxidizing agents, and short oligomeric chains which can decrease the quality and shorten the lifetime of an electronic device fabricated with the poly(3,4-alkylenedioxyheterocycle).

SUMMARY OF THE INVENTION

A method for preparing a defunctionalized alkylenedioxyheterocycle polymer or copolymer includes the steps of providing a polycarboxylic acid derivative functionalized alkylenedioxyheterocycle polymer or copolymer with a degree of polymerization from 10 to 1,000, the fraction of polycarboxylic acid derivative functionalized alkylenedioxyheterocycle units is 0.1 to 1.0, and when present one or more co-repeating units are derived from monomers selected from the group consisting of thiophene, bithiophene, terthiophene, 3-methylthiophene, 3-allylthiophene (alkyl=C2 to C20), 3-methoxythiophene, 3-alkoxythiophene (alkoxy=C2 to C20), 3,4-ethylenedioxythiophene, 3,4-propylenedioxythiophene, 3,4-butylenedioxythiophene, pyrrole, bipyrrole, 3-methylpyrrole, 3-alkylpyrrole (alkyl=C2 to C20), 3-methoxypyrrole, 3-alkoxypyrrole (alkoxy=C2 to C20), 3,4-ethylenedioxypyrrole, 3,4-propylenedioxypyrrole, 3,4-butylenedioxypyrrole, N-methylpyrrole, N-alkylpyrrole (alkyl=C2 to C20), N-methyl-3,4-ethylenedioxypyrrole, N-alkyl-3,4-ethylenedioxypyrrole (alkyl=C2 to C20), N-methyl-3,4-propylenedioxypyrrole, N-alkyl-3,4-propylenedioxypyrrole (alkyl=C2 to C20), carbazole, N-methylcarbazole, and N-alkylcarbazole (alkyl=C2 to C20); and transforming the polycarboxylic acid derivative functionalized alkylenedioxyheterocycle polymer or copolymer into a defunctionalized alkylenedioxyheterocycle polymer or copolymer comprising a polyhydroxy, polythiol, polyamino, or polycarboxylic acid functionalized alkylenedioxyheterocycle polymer or copolymer with a degree of polymerization from 10 to 1,000, the fraction of polycarboxylic acid derivative functionalized alkylenedioxyheterocycle units is 0.1 to 1.0, and when present one or more co-repeating units are derived from the monomers selected from the group consisting of thiophene, bithiophene, terthiophene, 3-methylthiophene, 3-alkylthiophene (alkyl=C2 to C20), 3-methoxythiophene, 3-alkoxythiophene (alkoxy=C2 to C20), 3,4-ethylenedioxythiophene, 3,4-propylenedioxythiophene, 3,4-butylenedioxythiophene, pyrrole, bipyrrole, 3-methylpyrrole, 3-alkylpyrrole (alkyl=C2 to C20), 3-methoxypyrrole, 3-alkoxypyrrole (alkoxy=C2 to C20), 3,4-ethylenedioxypyrrole, 3,4-propylenedioxypyrrole, 3,4-butylenedioxypyrrole, N-methylpyrrole, N-alkylpyrrole (alkyl=C2 to C20), N-methyl-3,4-ethylenedioxypyrrole, N-alkyl-3,4-ethylenedioxypyrrole (alkyl=C2 to C20), N-methyl-3,4-propylenedioxypyrrole, N-alkyl-3,4-propylenedioxypyrrole (alkyl=C2 to C20), carbazole, N-methylcarbazole, and N-alkylcarbazole (alkyl=C2 to C20).

The polycarboxylic acid derivative functionalized alkylenedioxyheterocycle repeating units of the polymer or copolymer have the structure:

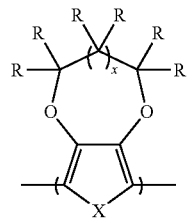

where x is 0 to 3; X is S, O, or NR'''; and R is independently H, —$(CH_2)_m$—YC(O)R', —$(CH_2)_m$—C(O)YR', —$(CH_2)_m$—O—$(CH_2)_v$YC(O)R', —$(CH_2)_m$—O—$(CH_2)_v$C(O)YR', —$(CH_2)_m$—OCH$_z$(CH$_3$)$_y$[(CH$_2$)$_w$YC(O)R']$_{3-z}$, or —$(CH_2)_m$—OCH$_z$(CH$_3$)$_y$[(CH$_2$)$_w$C(O)YR']$_{3-z}$ where at least two R groups are —$(CH_2)_m$—YC(O)R', —$(CH_2)_m$—C(O)YR', —$(CH_2)_m$—O—$(CH_2)_v$YC(O)R', —$(CH_2)_m$—O—$(CH_2)_v$C(O)YR', —$(CH_2)_m$—OCH$_z$(CH$_3$)$_y$[(CH$_2$)$_w$YC(O)R']$_{3-z}$, or —$(CH_2)_m$—OCH$_z$(CH$_3$)$_y$[(CH$_2$)$_w$C(O)YR']$_{3-z}$; m is 1 to 8; y is 0 to 2; z is 0 to 2; y+z is 0 to 2; w is 1 to 8; v is 2 to 8; Y is O, S, or NR'', R' is a straight chained, branched chain, cyclic or substituted cyclic alkyl group of 1 to 12 carbons, R'' is a straight chained, branched chain, cyclic or substituted cyclic alkyl group of 1 to 6 carbons, and R''' is H, straight chained, branched chain, cyclic or substituted cyclic alkyl group of 1 to 12 carbons, aryl, benzyl, alkylaryl, CH$_2$C(O)OR'''', or CH$_2$OC(O)R'''' where R'''' is H, straight chained, branched chain, cyclic or substituted cyclic alkyl group of 1 to 12 carbons, aryl, benzyl, or alkylaryl.

The polycarboxylic acid derivative functionalized alkylenedioxyheterocycle repeating units of the polymer or copolymer are preferably:

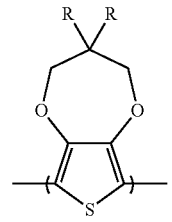

where R is —$(CH_2)_m$—YC(O)R', —$(CH_2)_m$—C(O)YR', —$(CH_2)_m$—O—$(CH_2)_w$YC(O)R', —$(CH_2)_m$—O—$(CH_2)_v$C(O)YR', —$(CH_2)_m$—OCH$_z$(CH$_3$)$_y$[(CH$_2$)$_w$YC(O)R']$_{3-z}$, or —$(CH_2)_m$—OCH$_z$(CH$_3$)$_y$[(CH$_2$)$_w$C(O)YR']$_{3-z}$; m is 1 to 8; y is 0 to 2; z is 0 to 2; y+z is 0 to 2; w is 1 to 8; v is 2 to 8; Y is O, S, or NR'', R' is a straight chained, branched chain, cyclic or substituted cyclic alkyl group of 1 to 12 carbons and R'' is a straight chained, branched chain, cyclic or substituted cyclic alkyl group of 1 to 6 carbons.

The polycarboxylic acid derivative functionalized alkylenedioxyheterocycle polymer or copolymer can be provided in a solvent, and, the solvent can be at least one solvent selected from the group consisting of chloroform, methylene chloride, ethyl acetate, toluene, and tetrahydrofuran. The method can include a step of removing the solvent to form a film. The solvent can be removed at a temperature of less than or equal to 100° C. and a pressure of 1 atmosphere or less.

The transforming reaction can be carried out thermally, photochemically, or by the addition of a cleaving reagent where the cleaving reagent can be water or an alcohol and can include a catalyst such as an alkali metal hydroxide When using a cleaving reagent it can be introduced in a second solvent that does not dissolve the polycarboxylic acid derivative functionalized alkylenedioxyheterocycle polymer or copolymer and can be water, methanol or ethanol. Once defunctionalization has occurred, the defunctionalized alkylenedioxyheterocycle polymer or copolymer can be extracted with a solvent. This polyhydroxy, polythiol, polyamino, or polycarboxylic acid functionalized alkylenedioxyheterocycle polymer or copolymer can then be heated to a second temperature at a second pressure to remove impurities resulting from the cleaving step. This second temperature is preferably less than or equal to 100° C. at a pressure of one atmosphere or less.

The method yields a polymer or copolymer with one or more defunctionalized alkylenedioxyheterocycle repeating units of the structure:

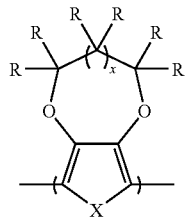

where x is 0 to 3; X is S, O, or NR'''; and R is independently H, —(CH$_2$)$_m$—Z, —(CH$_2$)$_m$—O—(CH$_2$)$_v$Z, or —(CH$_2$)$_m$—OCH$_z$[(CH$_2$)$_w$Z]$_{3-z}$ where at least two R groups are —(CH$_2$)$_m$—Z, —(CH$_2$)$_m$—O—(CH$_2$)$_v$Z, or —(CH$_2$)$_m$—OCH$_z$(CH$_3$)$_y$[(CH$_2$)$_w$Z]$_{3-y-z}$; m is 1 to 8; y is 0 to 2; z is 0 to 2; y+z is 0 to 2; w is 1 to 8; v is 2 to 8, and Z is OH, NHR', SH, or C(O)OH; and R''' is H, straight chained, branched chain, cyclic or substituted cyclic alkyl group of 1 to 12 carbons, aryl, benzyl, alkylaryl, CH$_2$C(O)OH, or CH$_2$OH.

The method preferably yields a polymer or copolymer with one or more defunctionalized alkylenedioxyheterocycle repeating units that can be:

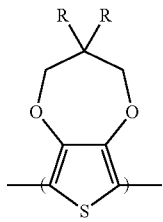

where R is —(CH$_2$)$_m$—Z, —(CH$_2$)$_m$—O—(CH$_2$)$_v$Z, or —(CH$_2$)$_m$—OCH$_z$[(CH$_2$)$_w$Z]$_{3-z}$; m is 1 to 8; y is 0 to 2; z is 0 to 2; y+z is 0 to 2; w is 1 to 8; v is 2 to 8, and Z is OH, NHR', SH, or C(O)OH.

A polycarboxylic acid derivative functionalized alkylenedioxyheterocycle polymer or copolymer can be singularly or in combination polycarboxylic acid derivative functionalized alkylenedioxyheterocycle repeating units of the structure:

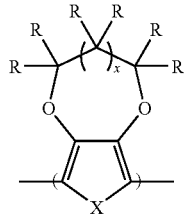

where x is 0 to 3; X is S, O, or NR'''; and R is independently H, —(CH$_2$)$_m$—YC(O)R', —(CH$_2$)$_m$—C(O)YR', —(CH$_2$)$_m$—O—(CH$_2$)$_v$YC(O)R', —(CH$_2$)$_m$—O—(CH$_2$)$_v$C(O)YR', —(CH$_2$)$_m$—OCH$_z$(CH$_3$)$_y$[(CH$_2$)$_w$YC(O)R']$_{3-z}$, or —(CH$_2$)$_m$—OCH$_z$(CH$_3$)$_y$[(CH$_2$)$_w$C(O)YR']$_{3-z}$ where at least two R groups are —(CH$_2$)$_m$—YC(O)R', —(CH$_2$)$_m$—C(O)YR', —(CH$_2$)$_m$—O—(CH$_2$)$_v$YC(O)R', —(CH$_2$)$_m$—O—(CH$_2$)$_v$C(O)YR', —(CH$_2$)$_m$—OCH$_z$(CH$_3$)$_y$[(CH$_2$)$_w$YC(O)R']$_{3-z}$, or —(CH$_2$)$_m$—OCH$_z$(CH$_3$)$_y$[(CH$_2$)$_w$C(O)YR']$_{3-z}$; m is 1 to 8; y is 0 to 2; z is 0 to 2; y+z is 0 to 2; w is 1 to 8; v is 2 to 8; Y is O, S, or NR'', R' is a straight chained, branched chain, cyclic or substituted cyclic alkyl group of 1 to 12 carbons, R'' is a straight chained, branched chain, cyclic or substituted cyclic alkyl group of 1 to 6 carbons, and R''' is H, straight chained, branched chain, cyclic or substituted cyclic alkyl group of 1 to 12 carbons, aryl, benzyl, or alkylaryl, CH$_2$C(O)OR'''', or CH$_2$OC(O)R'''' where R'''' is H, straight chained, branched chain, cyclic or substituted cyclic alkyl group of 1 to 12 carbons, aryl, benzyl, alkylaryl; and one or more heterocyclic repeating units derived from the monomers selected from the group consisting of thiophene, bithiophene, terthiophene, 3-methylthiophene, 3-alkylthiophene (alkyl=C2 to C20), 3-methoxythiophene, 3-alkoxythiophene (alkoxy=C2 to C20), 3,4-ethylenedioxythiophene, 3,4-propylenedioxythiophene, 3,4-butylenedioxythiophene, pyrrole, bipyrrole, 3-methylpyrrole, 3-alkylpyrrole (alkyl=C2 to C20), 3-methoxypyrrole, 3-alkoxypyrrole (alkoxy=C2 to C20), 3,4-ethylenedioxypyrrole, 3,4-propylenedioxypyrrole, 3,4-butylenedioxypyrrole, N-methylpyrrole, N-alkylpyrrole (alkyl=C2 to C20), N-methyl-3,4-ethylenedioxypyrrole, N-alkyl-3,4-ethylenedioxypyrrole (alkyl=C2 to C20), N-methyl-3,4-propylenedioxypyrrole, N-alkyl-3,4-propylenedioxypyrrole (alkyl=C2 to C20), carbazole, N-methylcarbazole, and N-alkylcarbazole (alkyl=C2 to C20), where the degree of polymerization of the copolymer is 10 to 1,000 and the fraction of polycarboxylic acid derivative functionalized alkylenedioxyheterocycle repeating units is 0.1 to 1.0.

The polycarboxylic acid derivative functionalized poly (alkylenedioxyheterocycle) can be

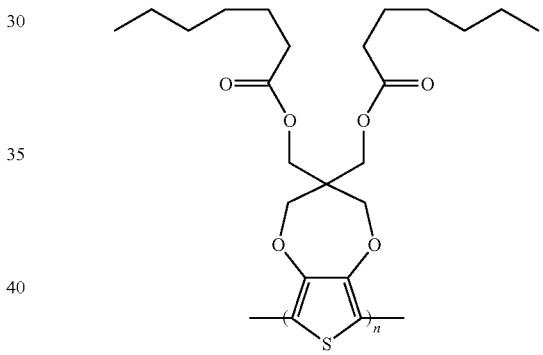

where n is 10 to 1,000.

The polycarboxylic acid derivative functionalized poly (alkylenedioxyheterocycle)

can be

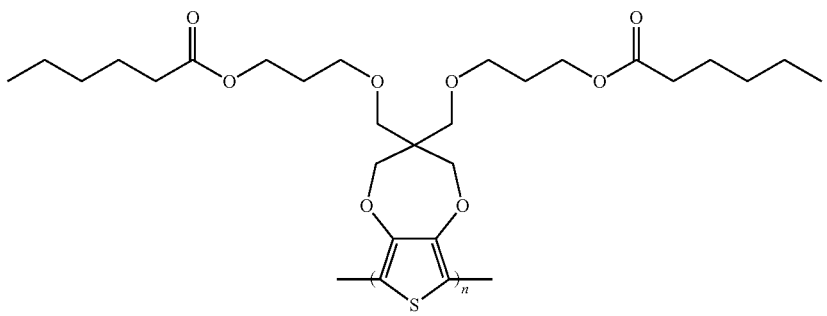

where n is 10 to 1,000.

The polycarboxylic acid derivative functionalized poly(alkylenedioxyheterocycle) can be

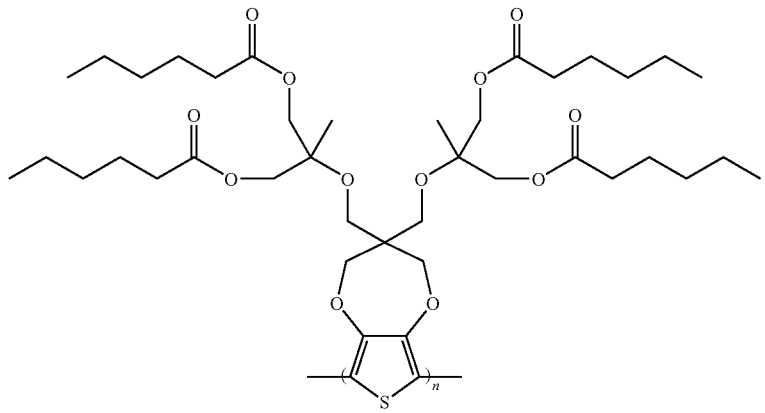

where n is 10 to 1,000.

The polycarboxylic acid derivative functionalized poly(alkylenedioxyheterocycle) comprises

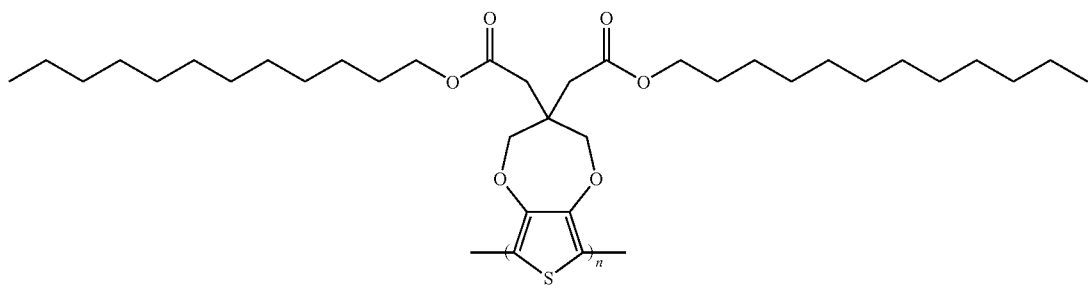

where n is 10 to 1,000.

A polyhydroxy, polythiol, polyamino, or polycarboxylic acid functionalized alkylenedioxyheterocycle polymer or copolymer can be singularly or in combination polyhydroxy, polythiol, polyamino, or polycarboxylic acid functionalized alkylenedioxyheterocycle repeating units of the structure:

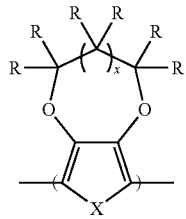

where x is 0 to 3; X is S, O, or NR'''; and R is independently H, $-(CH_2)_m-Z$, $-(CH_2)_m-O-(CH_2)_v Z$, or $-(CH_2)_m-OCH_z[(CH_2)_w Z]_{3-z}$ where at least two R groups are $-(CH_2)_m-Z$, $-(CH_2)_m-O-(CH_2)_v Z$, or $-(CH_2)_m-OCH_z(CH_3)_y[(CH_2)_w Z]_{3-y-z}$; m is 1 to 8; y is 0 to 2; z is 0 to 2; y+z is 0 to 2; w is 1 to 8; v is 2 to 8, and Z is OH, NHR', SH, or C(O)OH; and R''' is H, straight chained, branched chain, cyclic or substituted cyclic alkyl group of 1 to 12 carbons, aryl, benzyl, alkylaryl, $CH_2C(O)OH$, or $CH_2OH$ and one or more heterocyclic repeating units derived from the monomers selected from the group consisting of thiophene, bithiophene, terthiophene, 3-methylthiophene, 3-alkylthiophene (alkyl=C2 to C20), 3-methoxythiophene, 3-alkoxythiophene (alkoxy=C2 to C20), 3,4-ethylenedioxythiophene, 3,4-propylenedioxythiophene, 3,4-butylenedioxythiophene, pyrrole, bipyrrole, 3-methylpyrrole, 3-alkylpyrrole (alkyl=C2 to C20), 3-methoxypyrrole, 3-alkoxypyrrole (alkoxy=C2 to C20), 3,4-ethylenedioxypyrrole, 3,4-propylenedioxypyrrole, 3,4-butylenedioxypyrrole, N-methylpyrrole, N-alkylpyrrole (alkyl=C2 to C20), N-methyl-3,4-ethylenedioxypyrrole, N-allyl-3,4-ethylenedioxypyrrole (alkyl=C2 to C20), N-methyl-3,4-propylenedioxypyrrole, N-alkyl-3,4-propylenedioxypyrrole (alkyl=C2 to C20), carbazole, N-methylcarbazole, and N-alkylcarbazole (alkyl=C2 to C20), where the degree of polymerization of the copolymer is 10 to 1,000 and the fraction of polycarboxylic acid derivative functionalized alkylenedioxyheterocycle repeating units is 0.1 to 1.0.

A functionalized alkylenedioxyheterocycle polymer can be

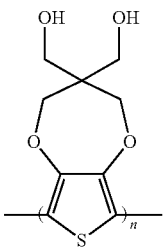

where n is 10 to 1,000.

The functionalized alkylenedioxyheterocycle polymer can be

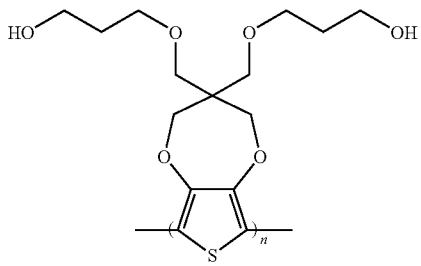

where n is 10 to 1,000.

The functionalized alkylenedioxyheterocycle polymer can be

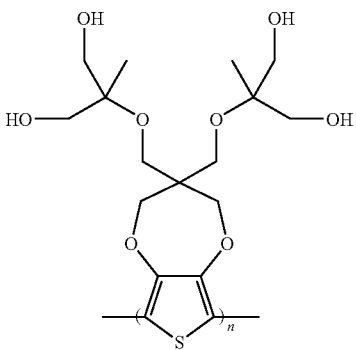

where n is 10 to 1,000.

The functionalized alkylenedioxyheterocycle polymer can be

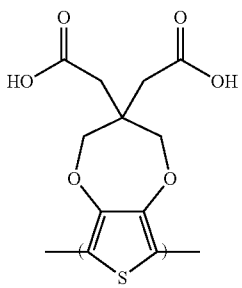

where n is 10 to 1,000.

A monomer for the preparation of polycarboxylic acid derivative functionalized poly(alkylenedioxyheterocycle) can have the structure:

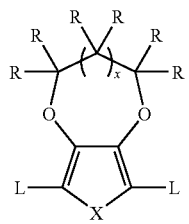

where x is 0 to 3; X is S, O, or NR'''; L is H, I, Br, Cl, OC(O)CF$_3$, or B(OR'''')$_2$ where R'''' is H, methyl, ethyl or the two R'''' groups are combined as terminal ends of an ethylene or propylene unit; and R is independently H, $-(CH_2)_m-YC(O)R'$, $-(CH_2)_m-C(O)YR'$, $-(CH_2)_m-O-(CH_2)_vYC(O)R'$, $-(CH_2)_m-O-(CH_2)_vC(O)YR'$, $-(CH_2)_m-OCH_z(CH_3)_y[(CH_2)_wYC(O)R']_{3-z}$, or $-(CH_2)_m-OCH_z(CH_3)_y[(CH_2)_wC(O)YR']_{3-z}$ where at least two R groups are $-(CH_2)_m-YC(O)R'$, $-(CH_2)_m-C(O)YR'$, $-(CH_2)_m-O-(CH_2)_vYC(O)R'$, $-(CH_2)_m-O-(CH_2)_vC(O)YR'$, $-(CH_2)_m-OCH_z(CH_3)_y[(CH_2)_wYC(O)R']_{3-z}$, or $-(CH_2)_m-OCH_z(CH_3)_y[(CH_2)_wC(O)YR']_{3-z}$; m is 1 to 8; y is 0 to 2; z is 0 to 2; y+z is 0 to 2; w is 1 to 8; v is 2 to 8; Y is O, S, or NR'', R' is a straight chained, branched chain, cyclic or substituted cyclic alkyl group of 1 to 12 carbons, R'' is a straight chained, branched chain, cyclic or substituted cyclic alkyl group of 1 to 6 carbons, and R''' is H, straight chained, branched chain, cyclic or substituted cyclic alkyl group of 1 to 12 carbons, aryl, benzyl, alkylaryl, CH$_2$C(O)OR'''', or CH$_2$OC(O)R'''' where R'''' is H, straight chained, branched chain, cyclic or substituted cyclic alkyl group of 1 to 12 carbons, aryl, benzyl, or alkylaryl.

BRIEF DESCRIPTION OF THE FIGURES

There are shown in the drawings, embodiments which are presently preferred, it being understood, however, that the invention is not limited to the precise arrangements and instrumentalities shown.

FIG. 7 is the UV-vis spectroscopy of ProDOT(CH$_2$OCH$_2$C(CH$_3$)(CH$_2$OC(O)C$_5$H$_{11}$)$_2$)$_2$ to PProDOT(CH$_2$OCH$_2$C(CH$_3$)(CH$_2$OH)$_2$)$_2$ and their characterization by UV-vis spectroscopy.

FIG. 8 is the IR spectra of (ProDOT and PProDOT esters) and (ProDOT and PProDOT alcohols)

DETAILED DESCRIPTION OF THE INVENTION

Figure 1:
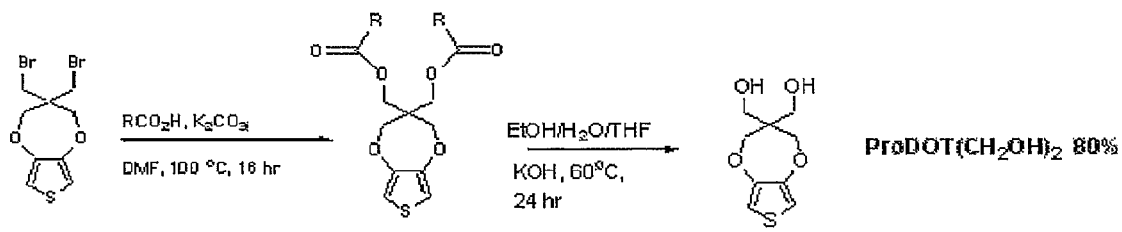
FIG. 1 shows the synthesis of ester substituted ProDOTs by substitution of ProDOT(CH$_2$Br)$_2$ with carboxylic acids and ProDOT(CH$_2$OH)$_2$ by saponification of ProDOT(CH$_2$OC(O)Et)$_2$.

A method to form insoluble poly(alkylenedioxyheterocycle) films is described herein. The methods involve preparation of a polymer containing polycarboxylic acid derivative functionalized alkylenedioxyheterocycle repeating units of sufficient solubility in common organic solvents such that the polymer solution can be spray, spin, or drop cast from solution to form a thin film of 25 to 5,000 nm in thickness. The polycarboxylic acid derivative functionalized alkylenedioxyheterocycle polymer film is rendered insoluble by submersion in a solution of a complimentary reactant in a second solvent that is not a solvent for the polymer film, and, optionally, heated to temperatures below the boiling point of the solvent until a film that is insoluble in the first solvent and in virtually all solvents results upon reaction of the carboxylic acid derivative to yield polyhydroxy, polythiol, polyamino, or polycarboxylic acid functionalized (alkylenedioxyheterocycle) repeating units in the polymer. The second solvent can be the complimentary reactant. The final polyhydroxy, polythiol, polyamino, or polycarboxylic acid functionalized poly(alkylenedioxyheterocycle) film is then, optionally, cooled, washed with the solvent of the complimentary reactant solution or another solvent, and dried under vacuum at temperatures below 100° C. In general it is preferred to carry out this method at temperatures of 100° C. or below and pressures of 1 atmosphere or below, however one of ordinary skill in the art can identify processing conditions that can be of greater temperature and pressures where the repeating units, solvents substrates and other components can tolerate higher temperatures and pressures and other conditions of the formation of the films would encourage the use of these conditions. This method allows for the isolation of a film in the neutral form of the polyhydroxy, polythiol, polyamino, or polycarboxylic acid functionalized alkylenedioxyheterocycle polymer.

The polymer containing polycarboxylic acid derivative functionalized alkylenedioxyheterocycle repeating units used in the inventive method can also be a copolymer of two or more polycarboxylic acid derivative functionalized alkylenedioxyheterocycle monomers and copolymers with other copolymerizable heterocyclic monomers. Among the heterocyclic monomers that can be use to prepare these copolymers are thiophene, bithiophene, terthiophene, 3-methylthiophene, 3-alkylthiophene (alkyl=C2 to C20), 3-methoxythiophene, 3-alkoxythiophene (alkoxy=C2 to C20), 3,4-ethylenedioxythiophene, 3,4-propylenedioxythiophene, 3,4-butylenedioxythiophene, pyrrole, bipyrrole, 3-methylpyrrole, 3-alkylpyrrole (alkyl=C2 to C20), 3-methoxypyrrole, 3-alkoxypyrrole (alkoxy=C2 to C20), 3,4-ethylenedioxypyrrole, 3,4-propylenedioxypyrrole, 3,4-butylenedioxypyrrole, N-methylpyrrole, N-alkylpyrrole (alkyl=C2 to C20), N-methyl-3,4-ethylenedioxypyrrole, N-alkyl-3,4-ethylenedioxypyrrole (alkyl=C2 to C20), N-methyl-3,4-propylenedioxypyrrole, N-alkyl-3,4-propylenedioxypyrrole (alkyl=C2 to C20), carbazole, N-methylcarbazole, and N-alkylcarbazole (alkyl=C2 to C20). One of ordinary skill can recognize which of the monomers from this group can be copolymerized with any individual or combination of the polycarboxylic acid derivative functionalized alkylenedioxyheterocycle monomers of the invention. One of ordinary skill can identify other known heterocyclic monomers that can be copolymerized with the inventive polycarboxylic acid derivative functionalized alkylenedioxyheterocycle monomers.

Novel polycarboxylic acid derivative functionalized poly(alkylenedioxyheterocycle)s homopolymers have the general structure:

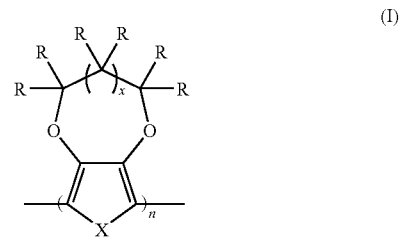

(I)

wherein n is 10 to 1,000; x is 0 to 3; X is S, O, or NR'''; and R is independently H, —(CH$_2$)$_m$—YC(O)R', —(CH$_2$)$_m$—C(O)YR', —(CH$_2$)$_m$—O—(CH$_2$)$_v$YC(O)R', —(CH$_2$)$_m$—O—(CH$_2$)$_v$C(O)YR', —(CH$_2$)$_m$—OCH$_z$(CH$_3$)$_y$[(CH$_2$)$_w$YC(O)R']$_{3-z}$, or —(CH$_2$)$_m$—OCH$_z$(CH$_3$)$_y$[(CH$_2$)$_w$C(O)YR']$_{3-z}$ where at least two R groups are —(CH$_2$)$_m$—YC(O)R', —(CH$_2$)$_m$—C(O)YR', —(CH$_2$)$_m$—O—(CH$_2$)$_v$YC(O)R', —(CH$_2$)$_m$—O—(CH$_2$)$_v$C(O)YR', —(CH$_2$)$_m$—OCH$_z$(CH$_3$)$_y$[(CH$_2$)$_w$YC(O)R']$_{3-z}$, or —(CH$_2$)$_m$—OCH$_z$(CH$_3$)$_y$[(CH$_2$)$_w$C(O)YR']$_{3-z}$; m is 1 to 8; y is 0 to 2; z is 0 to 2; y+z is 0 to 2; w is 1 to 8; v is 2 to 8; Y is O, S, or NR'', R' is a straight chained, branched chain, cyclic or substituted cyclic alkyl group of 1 to 12 carbons, R'' is a straight chained, branched chain, cyclic or substituted cyclic alkyl group of 1 to 6 carbons, and R''' is H, straight chained, branched chain, cyclic or substituted cyclic alkyl group of 1 to 12 carbons, aryl, benzyl, alkylaryl, CH$_2$C(O)OR'''', or CH$_2$O(C)R'''' where R'''' is H, straight chained, branched chain, cyclic or substituted cyclic alkyl group of 1 to 12 carbons, aryl, benzyl, or alkylaryl. The desired solubility in organic solvents is achieved when at least two substituents, R, are not hydrogens but the substituents contain a carboxylic acid derivative. These novel polymers are prepared from the corresponding novel monomers where the bonds between repeating units of the polymers are replaced by bonds to hydrogen atoms in the monomers. Synthetic routes to these monomers and polymers are given by specific examples below.

After forming a film of the polycarboxylic acid derivative functionalized poly(alkylenedioxyheterocycle) the polymer can be converted into a polyhydroxy, polyamino, or polycarboxylic acid functionalized poly(alkylenedioxyheterocycle) of the complementary structure given by the formula (I) above wherein n is 10 to 1,000; x is 0 to 3; X is S, O, or NR'''; and R is independently H, —(CH$_2$)$_m$—Z, —(CH$_2$)$_m$—O—(CH$_2$)$_v$Z, or —(CH$_2$)$_m$—OCH$_z$[(CH$_2$)$_w$Z]$_{3-z}$ where at least two R groups are —(CH$_2$)$_m$—Z, —(CH$_2$)$_m$—O—(CH$_2$)$_v$Z, or —(CH$_2$)$_m$—OCH$_z$(CH$_3$)$_y$[(CH$_2$)$_w$Z]$_{3-y-z}$; m is 1 to 8; y is 0 to 2; z is 0 to 2; y+z is 0 to 2; w is 1 to 8; v is 2 to 8, and Z is OH, NHR', SH, or C(O)OH; and R''' is H, straight chained, branched chain, cyclic or substituted cyclic alkyl group of 1 to 12 carbons, aryl, benzyl, alkylaryl, CH$_2$C(O)OHR'''' or CH$_2$OH. The conversion can be carried out with an acid or base depending upon the functionality to be cleaved. The solvent for the acid or base can be water, methanol, ethanol, other organic solvents or mixtures thereof, such that the starting polycarboxylic acid derivative functionalized poly(alkylenedioxythiophene) film and final polyhydroxy, polythiol, polyamino, or polycarboxylic acid functionalized poly(alkylenedioxyheterocycle) film is insoluble. When the polycarboxylic acid derivative functionalized poly(alkylenedioxyheterocycle) is substituted with an R group of $-(CH_2)_m-O-(CH_2)_vC(O)YR'$, $-(CH_2)_m-OCH_z(CH_3)_y[(CH_2)_wYC(O)R']_{3-z}$, or $-(CH_2)_m-OCH_z(CH_3)_y[(CH_2)_wC(O)YR']_3$, Y is O, and R' has the branched alkyl structure $-C(CH_3)_2R''''$ where R'''' is a straight chain alkyl chain with 1 to 9 carbons, the ester is susceptible to cleavage upon thermolysis with the formation of the carboxylic acid and an alkene.

A preferred polycarboxylic acid derivative functionalized poly(alkylenedioxyheterocycle) is a multi-ester functionalized poly(propylenedioxythiophene) of the structure:

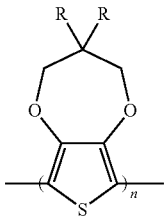

wherein n is 10 to 1,000; R is independently $-(CH_2)_m-OC(O)R'$, $-(CH_2)_m-C(O)OR'$, $-(CH_2)_m-O-(CH_2)_vOC(O)R'$, or $-(CH_2)_m-OCH_z(CH_3)_y[(CH_2)_wOC(O)R']_{3-z}$; m is 1 to 8; y is 0 to 2; z is 0 to 2; y+z is 0 to 2; w is 1 to 8; v is 2 to 8; and R' is a straight chained or branched alkyl group of 1 to 12 carbons. Saponification of these multi-ester functionalized poly(propylenedioxythiophene)s yield polyhydroxy functionalized poly(propylenedioxythiophene)s or polycarboxylic acid functionalized poly(propylenedioxythiophene)s of the complementary structure given by the formula above wherein n is 10 to 100; R is independently $-(CH_2)_m-OH$, $-(CH_2)_m-C(O)OH$, $-(CH_2)_m-O-(CH_2)_m-OH$, or $-(CH_2)_m-OCH_z(CH_3)_y[(CH_2)_wOH]_{3-z}$; m is 1 to 8; y is 0 to 2; z is 0 to 2; y+z is 0 to 2; w is 1 to 8 and v is 2 to 8. Variations of the values of m, v, and w, changing the size of the alkyl portion of the ester group, R', and varying the number of ester groups, 3-y-z per substituent, permits the variation in solubility and other properties of the polymers. The symmetry of the regioregular polyhydroxy functionalized poly(propylenedioxythiophene) or polycarboxylic acid functionalized poly(propylenedioxythiophene) is believed to contribute to the desired properties of the insoluble film.

The polycarboxylic acid derivative functionalized poly(alkylenedioxyheterocycle)s and all copolymers can be prepared by the polymerization of novel heterocyclic monomers that can be polymerized by any available polymerization technique including any catalytic, electrolytic, thermolytic, or other chemically induced method. By using the appropriate known polymerization methods, monomers can have any of the following structure:

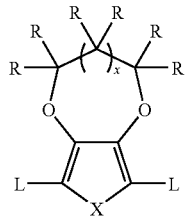

where x is 0 to 3; X is S, O, or NR'''; L is H, I, Br, Cl, OC(O)CF_3, or B(OR'''')_2 where R'''' is H, methyl, ethyl or the two R'''' groups are combined as terminal ends of an ethylene or propylene unit; and R is independently H, $-(CH_2)_m-YC(O)R'$, $-(CH_2)_m-C(O)YR'$, $-(CH_2)_m-O-(CH_2)_vYC(O)R'$, $-(CH_2)_m-O-(CH_2)_vC(O)YR'$, $-(CH_2)_m-OCH_z(CH_3)_y[(CH_2)_wYC(O)R']_{3-z}$, or $-(CH_2)_m-OCH_2(CH_3)_y[(CH_2)_wC(O)YR']_{3-z}$ where at least two R groups are $-(CH_2)_m-YC(O)R'$, $-(CH_2)_m-C(O)YR'$, $-(CH_2)_m-O-(CH_2)_vYC(O)R'$, $-(CH_2)_m-O-(CH_2)_vC(O)YR'$, $-(CH_2)_m-OCH_z(CH_3)_y[(CH_2)_wYC(O)R']_{3-z}$, or $-(CH_2)_m-OCH_z(CH_3)_y[(CH_2)_wC(O)YR']_{3-z}$; m is 1 to 8; y is 0 to 2; z is 0 to 2; y+z is 0 to 2; w is 1 to 8; v is 2 to 8; Y is O, S, or NR'', R' is a straight chained, branched chain, cyclic or substituted cyclic alkyl group of 1 to 12 carbons, R'' is a straight chained, branched chain, cyclic or substituted cyclic alkyl group of 1 to 6 carbons, and R''' is H, straight chained, branched chain, cyclic or substituted cyclic alkyl group of 1 to 12 carbons, aryl, benzyl, alkylaryl, CH_2C(O)OR'''', or CH_2OC(O)R'''' where R'''' is H, straight chained, branched chain, cyclic or substituted cyclic alkyl group of 1 to 12 carbons, aryl, benzyl, or alkylaryl.

The polycarboxylic acid derivative functionalized poly(alkylenedioxyheterocycle)s can be a copolymer of two or more monomers that yield the functionalized (alkylenedioxyheterocycle) repeating units described above. It can also be a copolymer of one or more monomers that yield the functionalized (alkylenedioxyheterocycle) repeating units described above and one or more heterocyclic monomers. Among the monomers that can be used to prepare these copolymers are thiophene, bithiophene, terthiophene, 3-methylthiophene, 3-alkylthiophene (alkyl=C2 to C20), 3-methoxythiophene, 3-alkoxythiophene (alkoxy=C2 to C20), 3,4-ethylenedioxythiophene, 3,4-propylenedioxythiophene, 3,4-butylenedioxythiophene, pyrrole, bipyrrole, 3-methylpyrrole, 3-alkylpyrrole (alkyl=C2 to C20), 3-methoxypyrrole, 3-alkoxypyrrole (alkoxy=C2 to C20), 3,4-ethylenedioxypyrrole, 3,4-propylenedioxypyrrole, 3,4-butylenedioxypyrrole, N-methylpyrrole, N-alkylpyrrole (alkyl=C2 to C20), N-methyl-3,4-ethylenedioxypyrrole, N-alkyl-3,4-ethylenedioxypyrrole (alkyl=C2 to C20), N-methyl-3,4-propylenedioxypyrrole, N-alkyl-3,4-propylenedioxypyrrole (alkyl=C2 to C20), carbazole, N-methylcarbazole, and N-alkylcarbazole (alkyl=C2 to C20). One skilled in the art can readily identify other monomers which can be copolymerized in the practice of this invention with at least one of the above described polycarboxylic acid derivative functionalized (alkylenedioxyheterocycle)s. The proportion of the polycarboxylic acid derivative functionalized (alkylenedioxyheterocycle) monomers in these copolymer can range from more than 99 percent to about 20 or even 10 percent depending upon the length and the polarity, branching, and other features of the solubilizing polycarboxylic acid derivative side chain.

The invention is expected to have application for uses as: hole transport layers in organic light emitting diodes; active electrochrome in electrochromic windows, mirrors and displays; field effect transistors, supercapacitors, batteries, photovoltaic cells, and other electronic components; electronic paper; anti-stat conductors; and transparent conductors. Features of preparing compounds, practicing the method, and characterizing the polymers for some embodiments of the invention are presented in non-limiting examples and are provided for illustration purposes and do not encompass the entire scope of the invention.

Example 1

Ester derivatized 3,4-propylenedioxythiophenes (ProDOTs) were synthesized by substitution of 3,3-Bis(bromomethyl)-3,4-dihydro-2H-thieno[3,4-b][1,4]dioxepine (ProDOT(CH$_2$Br)$_2$) with carboxylic acids using K$_2$CO$_3$ as shown in FIG. 1. This reaction produces esters that can be hydrolyzed to afford 3,3-Bis(hydroxymethyl)-3,4-dihydro-2H-thieno[3,4-b][1,4]dioxepine (ProDOT(CH$_2$Br)$_2$) (ProDOT (CH$_2$OH)$_2$) in good yield. ProDOT(CH$_2$OH)$_2$ may be a versatile building block toward new ProDOT structures and may improve overall yields of compounds synthesized by the Williamson etherification of ProDOT(CH$_2$Br)$_2$.

Example 2

Figure 2:
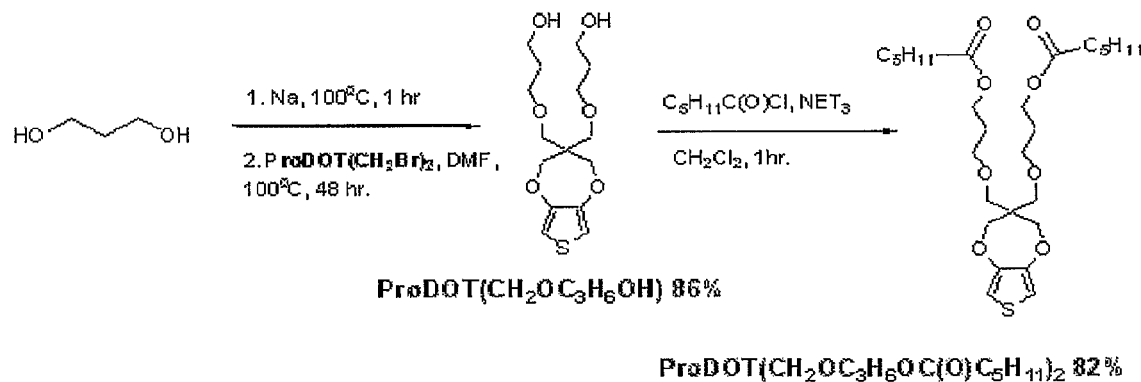
FIG. 2 shows the synthesis of ProDOT(CH$_2$OC$_3$H$_6$OC(O)C$_5$H$_{11}$)$_2$ by a Williamson etherification followed by acylation.

A second method used to synthesize ester substituted ProDOTs starts with the synthesis of alcohols from ProDOT (CH$_2$Br)$_2$ followed by acylation. ProDOT(CH$_2$OC$_3$H$_6$OH), 3,3-Bis(3-hydroxypropoxymethyl)-3,4-dihydro-2H-thieno[3,4-b][1,4]dioxepine was synthesized by first making an 10 equivalent alkoxy solution of 1,3-propanediol by adding 0.25 eq of sodium to the diol. Then a 1.5 M ProDOT(CH$_2$Br)$_2$ solution in DMF was added as illustrated in FIG. 2. This minimum amount of DMF is required for the reaction to work as early attempts without it failed. The 10 equivalent excess of 1,3-propanediol alkoxide ensured the formation of the diol over the formation of the eight-membered ring. The addition of 0.25 equivalents of sodium with respect to the diol likely leads to a high concentration of monoalkoxide and little formation of the dialkoxide. The reaction was complete in 48 hours as determined by TLC and the diol was purified by column chromatography. Hexanoic acid acyl chloride (4 equivalents) was added to a ProDOT(CH$_2$OC$_3$H$_6$OH) solution in methylene chloride and triethylamine. After 1 hour, the reaction was complete, and after work up, the yellow oil was purified by column chromatography to afford ProDOT (CH$_2$OC$_3$H$_6$OC(O)C$_6$H$_{13}$)$_2$, 3,3-Bis(3-heptanoyloxypropoxymethyl)-3,4-dihydro-2H-thieno[3,4-b][1,4]dioxepine, as a clear oil.

Example 3

Figure 3:
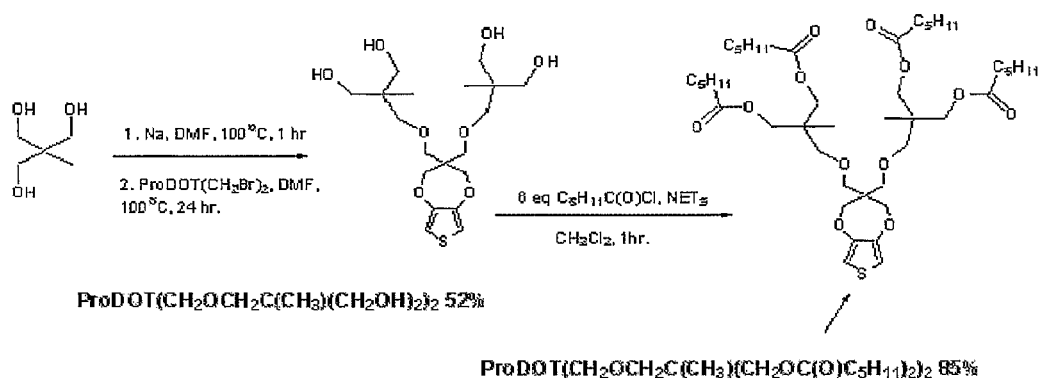
FIG. 3 shows the synthesis of ProDOT(CH$_2$OCH$_2$C(CH$_3$)(CH$_2$OC(O)C$_5$H$_{11}$)$_2$)$_2$ by a Williamson etherification followed by acylation.

ProDOT(CH$_2$OCH$_2$C(CH$_3$)(CH$_2$OH)$_2$) was synthesized using a similar methodology as shown in FIG. 3. The alcohol, 2-hydroxymethyl-2-methylpropane-1,3-diol, was dissolved in a minimum amount of DMF. Sodium (0.25 eq) was then added and heated to 100° C. for 1 hour to dissolve. A 1.5 M solution of ProDOT(CH$_2$Br)$_2$ in DMF was then added and heated overnight. After 24 hours, the starting material was completely converted, as seen by TLC. Water was added to the reaction flask and the product was extracted five times, monitoring the existence of the product by observing the ultraviolet absorbance of the extract on TLC plates. After five extractions, the IV absorbance of the methylene chloride was minimal. ProDOT(CH$_2$OCH$_2$C(CH$_3$)(CH$_2$OH)$_2$) was purified to afford a clear oil and subjected to 6 equivalents of hexanoic acid acyl chloride, and after 1 hour, the reaction was complete.

Example 4

Figure 4:
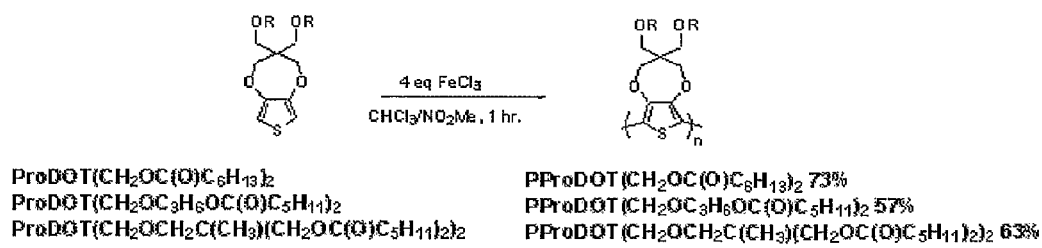
FIG. 4 shows the synthesis of ester substituted PProDOTs by oxidative polymerization.

Ester substituted PProDOTs were synthesized by oxidative polymerization using FeCl$_3$ as shown in FIG. 4. The reaction was performed by adding an FeCl$_3$/NO$_2$Me solution to a monomer/CHCl$_3$ solution turning the color from clear to green to black during addition. The reaction was run at room temperature and for only 1 hour to minimize hydrolysis of the esters in the acidic environment. Hydrazine reduced the polymer, immediately turning the color from black to bright fluorescent red. The photoluminescence quantum efficiencies of toluene of the oligoether and ester polymers are listed in Table 1. Chloroform was then added and the red solution was washed with 1 M HCl to remove the oxidizing agent. The solvent was removed and the resulting purple solid was redissolved in chloroform and precipitated in methanol. Filtration afforded the pure polymer, which was soluble in common solvents such as toluene and THF as well as ethyl acetate.

TABLE 1

Peaks taken from the absorbance and photoluminescence spectra and quantum efficiencies of polymer solutions in toluene.

| | $\lambda_{(absorbance)}$ | $\lambda_{(fl)}$ | $\phi_{fl}$ |
|---|---|---|---|
| PProDOT(CH$_2$OC(O)C$_6$H$_{13}$)$_2$ | 535 | 604, 656 | 0.24 |
| PProDOT(CH$_2$OC$_3$H$_6$OC(O)C$_5$H$_{11}$)$_2$ | 538 | 602, 652 | 0.30 |
| ProDOT(CH$_2$OCH$_2$C(CH$_3$)(CH$_2$OC(O)C$_5$H$_{11}$)$_2$)$_2$ | 531 | 595, 645 | 0.32 |

Example 6

Figure 5:
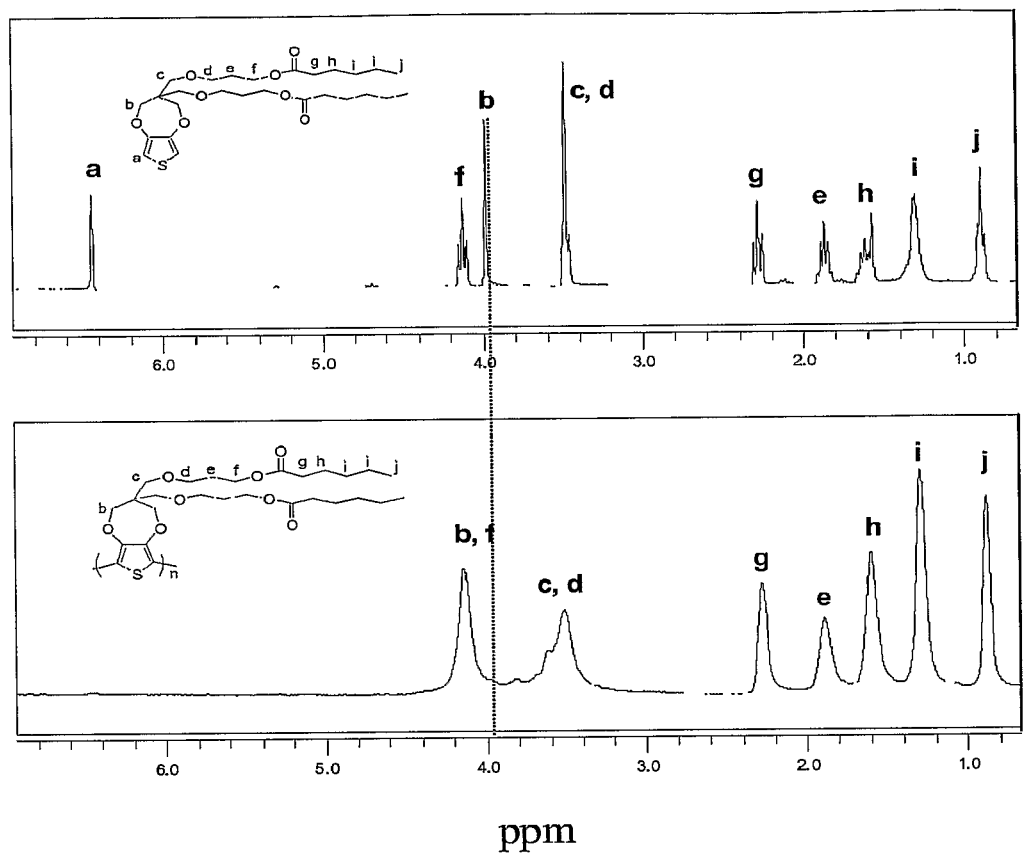
FIG. 5 is the $^1$H NMR spectra of ProDOT(CH$_2$OC$_3$H$_6$OC(O)C$_5$H$_{11}$)$_2$ and PProDOT(CH$_2$OC$_3$H$_6$OC(O)C$_5$H$_{11}$)$_2$.

The proton NMR spectra of ProDOT(CH$_2$OC$_3$H$_6$OC(O)C$_5$H$_{11}$)$_2$ and ProDOT(CH$_2$OC$_3$H$_6$OC(O)C$_5$H$_{11}$)$_2$ are shown in FIG. 5. Again, the major difference between the monomer and polymer is the absence of the thienyl proton signal (a) and the broadening of the peaks in the polymer spectrum. The protons on the ProDOT bridge (b) are deshielded in the polymer compared to the monomer by 0.15 ppm and the signal overlaps with the methylene protons attached to the ester oxygen (f). The alkoxy methylene protons (c and d) at 3.50 ppm overlap with one another in both the polymer and monomer and a shoulder exists in the polymer spectrum at 3.6 ppm, indicative of a down-field shift of the methylene protons next to the propylene ring (c). The methylene protons at 2.3, 1.9, 1.6, 1.3, and 0.9 ppm (g, e, h, i, j respectively) give splitting patterns as expected in the monomer spectrum, which fall at the same frequency for the polymer, but do not resolve. The up-field shift is most apparent for protons closest to the polymer backbone. A peak corresponding to water from dueterated chloroform falls at 1.5 ppm, close to the multiplet from the methylene protons (e).

Example 7

Molecular weights of all polymers synthesized were estimated by GPC vs polystyrene standards and are listed in Table 2. The values of the number average degree of polymerization ($X_n$) falling between 13 and 30 rings. The polydispersities were all lower than 2 after purification by precipitation, with all having similar PDI values.

TABLE 2

GPC molecular weight (g/mol) estimation of oligoesters substituted PProDOTs.

| | $M_n$ | $M_w$ | $X_n$ | PDI |
|---|---|---|---|---|
| PProDOT(CH$_2$OC(O)C$_5$H$_{11}$)$_2$ | 9,000 | 13,300 | 20 | 1.5 |
| PProDOT(CH$_2$OC$_3$H$_6$OC(O)C$_5$H$_{11}$)$_2$ | 12,300 | 19,300 | 24 | 1.6 |
| ProDOT(CH$_2$OCH$_2$C(CH$_3$)(CH$_2$OC(O)C$_5$H$_{11}$)$_2$)$_2$ | 10,900 | 16,500 | 13 | 1.5 |

Example 8

Thermogravimetric analysis of all polymers were performed scanning from 50° C. to 800° C. at 20° C./minute. No evidence of degradation was observed below 150° C. in all cases. An onset of weight loss exists between 290° C. and 320° C. The ester substituents did not thermally cleave, but rather the polymer degraded continuously. DSC scans from −150 to 100° C. at 10° C./min were absent of transitions for the oligoether substituted PProDOTs.

Example 9

Figure 6:
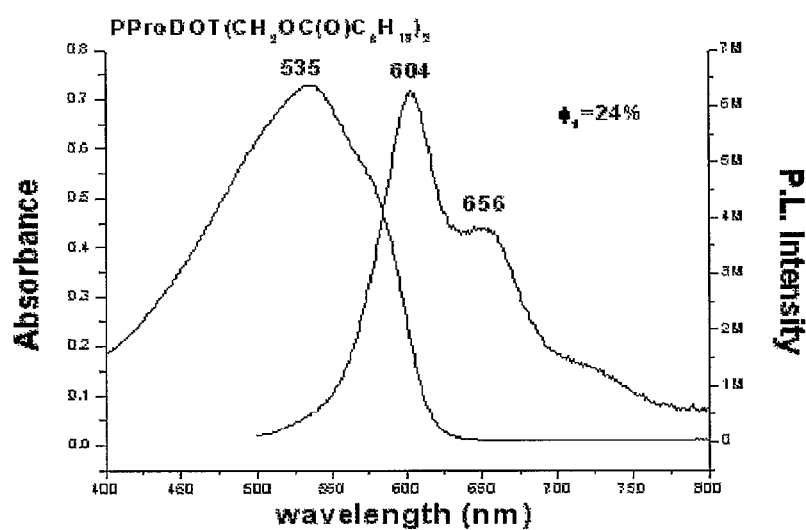
FIG. 6 is the UV-vis absorbance and fluorescence emission spectra of PProDOT(CH$_2$OC(O)C$_6$H$_{13}$)$_2$.

Solution absorbance and fluorescence spectroscopy was performed on polymers in toluene. The ester substituted PProDOTs show only one unresolved peak in the absorbance spectrum and two peaks in the photoluminescence spectrum, as seen for PProDOT(CH$_2$OC(O)C$_6$H$_{13}$)$_2$ in FIG. 6. The peaks as well as the quantum efficiencies are listed in Table 3. The fine structure in the photoluminescence spectrum is due to vibronic coupling, while the absorbance peaks are less understood. The quantum efficiencies were lower (25-30%) in general in comparison to the polymers synthesized by Grignard metathesis (30-50%), possibly due to different solubilities in toluene or fluorescence quenching by iron impurities. The ester substituted PProDOT(CH$_2$OC(O)C$_5$H$_{11}$)$_2$ exhibited quantum efficiencies of 0.22-0.24. The bulkier PProDOT(CH$_2$OC$_3$H$_6$OC(O)C$_5$H$_{11}$)$_2$ and PProDOT(CH$_2$OCH$_2$C(CH$_3$)(CH$_2$OC(O)C$_5$H$_{11}$)$_2$)$_2$ exhibited higher quantum efficiencies, likely due to less aggregation of the polymer chain. PProDOT(CH$_2$OCH$_2$C(CH$_3$)(CH$_2$OC(O)C$_5$H$_{11}$)$_2$)$_2$ solutions were red-orange, a 5-10 nm blue shift of the $\lambda_{max}$ in comparison to the other polymers, which are bright red.

TABLE 3

Peaks taken from the absorbance and photoluminescence spectra and quantum efficiencies of polymer solutions in toluene.

| | $\lambda_{(absorbance)}$ | $\lambda_{(fl)}$ | $\phi_{fl}$ |
|---|---|---|---|
| PProDOT(CH$_2$OC(O)C$_6$H$_{13}$)$_2$ | 535 | 604, 656 | 0.24 |
| PProDOT(CH$_2$OC$_3$H$_6$OC(O)C$_5$H$_{11}$)$_2$ | 538 | 602, 652 | 0.30 |
| ProDOT(CH$_2$OCH$_2$C(CH$_3$)(CH$_2$OC(O)C$_5$H$_{11}$)$_2$)$_2$ | 531 | 595, 645 | 0.32 |

Example 10

Ester substituted PProDOTs were spray cast onto ITO coated glass slides from toluene solutions, dried under vacuum, and then submersed in a 0.1 M KOH methanol solution and heated at 60° C. for 1 hour to remove the ester groups. The solution turns light pink after half an hour of heating in the case of PProDOT(CH$_2$OC$_3$H$_6$OC(O)C$_5$H$_{11}$)$_2$ and PProDOT(CH$_2$OCH$_2$C(CH$_3$)(CH$_2$OC(O)C$_5$H$_{11}$)$_2$)$_2$, indicating slight solubility of the hydrolyzed polymer, while PProDOT(CH$_2$OC(O)C$_6$H$_{13}$)$_2$ did not discolor the solution. The treated films of all polymers were insoluble in non-polar solvents, ethyl acetate, and water. In the cases of PProDOT(CH$_2$OC(O)C$_6$H$_{13}$)$_2$ and PProDOT(CH$_2$OC$_3$H$_6$OC(O)C$_5$H$_{11}$)$_2$, the polymer films are blue-purple which stay the same perceivable color after methanolysis of the esters, with a band gap of 1.8 eV. In contrast, PProDOT(CH$_2$OCH$_2$C(CH$_3$)(CH$_2$OC(O)C$_5$H$_{11}$)$_2$)$_2$ solutions spray cast to form films of burgundy color that have a higher band gap than all other polymers at 2.0 eV with a $\lambda_{max}$ of 541 nm. (a). FIG. 7 shows the electronic spectra of the spray cast PProDOT(CH$_2$OCH$_2$C(CH$_3$)(CH$_2$OC(O)C$_5$H$_{11}$)$_2$)$_2$ film and PProDOT(CH$_2$OCH$_2$C(CH$_3$)(CH$_2$OH)$_2$)$_2$. After methanolysis, the film changes color to a blue-purple with a slightly lower band-gap of 1.95 eV and exhibits two peaks at 595 and 556 nm, a considerable red shift in comparison to the ester substituted polymer spectrum. The film is then cooled, washed with methanol, and vacuum dried at 50° C. The color change suggests that the esters decrease the effective conjugation length of the polymer due to the steric bulk. This is relieved upon removal of the ester, resulting in a smaller band gap (1.95 eV), a red shift of the electronic spectrum, and a different perceivable color.

Example 11

The insoluble alcohol substituted polymers were characterized by IR spectroscopy. FIG. 8 compares the IR spectra of ester and alcohol substituted ProDOTs along with the polymers. The esters exhibit a strong absorbance at 1740 cm$^{-1}$ corresponding to the carbonyl stretch. This peak disappears upon saponification while an OH stretch at 3350 cm$^{-1}$ appears, indicating the esters are fully converted to alcohols in the solid state. Little changes in the IR spectra are observed between the ester and alcohol substituted polymer and monomer with the exception of the disappearance of a peak at 3110 cm$^{-1}$, corresponding to the C—H stretch of the thiophene ring. This is further evidence of a substantial molecular weight.

Example 12

Spray cast films were saponified and the resulting alcohol substituted PProDOT films were also characterized. PPro- DOT(CH$_2$OC(O)C$_6$H$_{13}$)$_2$, PProDOT(CH$_2$OCH$_2$C(CH$_3$)(CH$_2$OC(O)C$_5$H$_{11}$)$_2$)$_2$, and PProDOT(CH$_2$OCH$_2$C(CH$_3$)(CH$_2$OH)$_2$)$_2$ could be reversibly switched between the oxidized and neutral state while the oxidized state of PProDOT(CH$_2$OC$_3$H$_6$OC(O)C$_5$H$_{11}$)$_2$, PProDOT(CH$_2$OC$_3$H$_6$OH)$_2$, and PProDOT(CH$_2$OCH$_2$C(CH$_3$)(CH$_2$OC(O)C$_5$H$_{11}$)$_2$)$_2$, dissolve in water, propylenecarbonate, and acetonitrile, and therefore were not studied. The solubility of the oxidized form of ester and alcohol substituted polymers coupled with the insolubility in nonpolar solvents can be advantageous for the processing of hole transport layers in the fabrication of electronic devices such as polymer light emitting diodes and photovoltaic devices.

Figure 9:
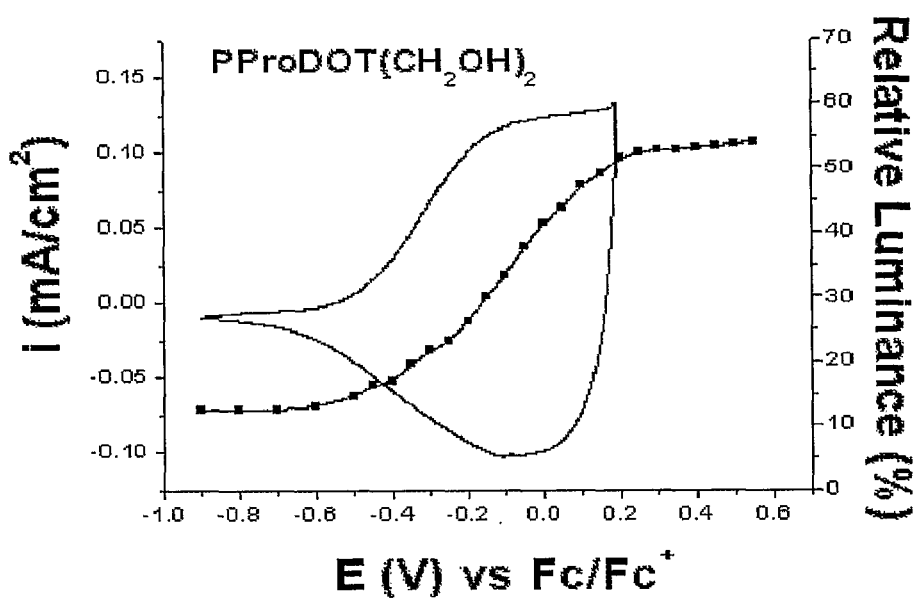
FIG. 9 shows the cyclic voltammetry and luminance via colorimetry characterization of a film of PProDOT(CH$_2$OH)$_2$ in 0.1 M TBAPF$_6$/PC.

PProDOT(CH$_2$OC(O)C$_6$H$_{12}$)$_2$ films were formed by either potentiostatic electrodeposition at 1.2 V or by spray casting from toluene solution. The E$_{1/2}$ for both types of films was found to be approximately 0.0 V, switching the color from blue-purple to transmissive. The films were then treated by submersion in 0.1 M KOH in methanol and heated at 60° C. for 1 hour. After cooling, washing the films in methanol, and drying over a stream of argon, the films were examined by cyclic voltammetry, as seen in FIG. 9 and the relative luminance percent is superimposed on the current response to analyze the relationship between the color change and the current response. The films switch between a colored dark blue neutral state to a transmissive oxidized state with a change in relative luminance of (Δ% Y) of 42%. The onset of color change occurs at an unusually low potential of −0.6 V, much lower than the analogous ester polymer or other PProDOTs (see section 5.3.1). This is an indication of the large range of chemical environments and effective conjugation lengths influenced by the diol substituents. The redox process is broad, making the E$_{1/2}$ assignment difficult.

Example 13

Figure 10:
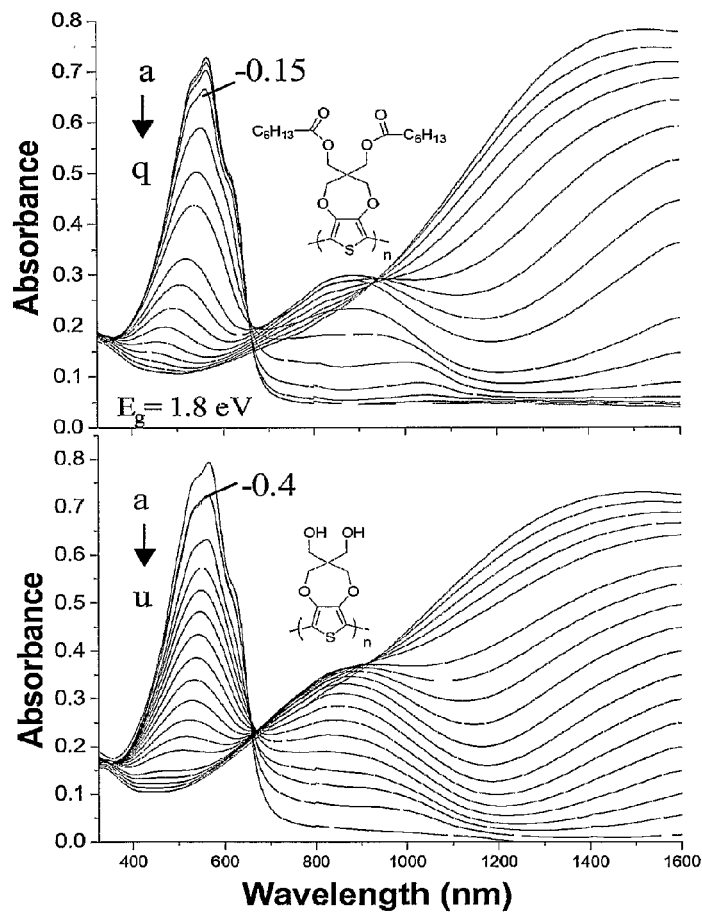
FIG. 10 shows the characterization of PProDOT(CH$_2$OC(O)C$_6$H$_{13}$)$_2$ and PProDOT(CH$_2$OH)$_2$ spectroelectrochemically at various potentials vs Fc/Fc$^+$.

Spectroelectrochemistry was performed, as seen in FIG. 10, on a spray cast film of PProDOT(CH$_2$OC(O)C$_6$H$_{13}$)$_2$ as well as a film of PProDOT(CH$_2$OH)$_2$ to study how the saponification process affects the electronic properties of the resulting polymer. Little change is observed between the two polymers. The neutral polymers both have band-gaps of 1.8 eV with λ$_{max}$ of 567 nm and similar fine structure. Upon oxidation, the alcohol substituted polymer begins to change color at potentials 300 mV lower than the ester substituted polymer. This was consistent with the luminance and cyclovoltammetry studies performed and seen in FIG. 9, where the onset of current response and color change occurs at remarkably low potentials.

Example 14

Switching studies were performed on ester and alcohol substituted PProDOT films at the λ$_{max}$ of the polymer and measurements are listed in Table 4. Contrast ratios of PProDOT(CH$_2$OC(O)C$_6$H$_{13}$)$_2$ and PProDOT(CH$_2$OH)$_2$ were approximately 60% and switching times were under a second. The composite coloration efficiency (CE) of the ester polymer was substantially higher than the alcohol polymer, which is consistent with other work which determined that increasing the size of the substituent groups on PProDOTs increases the composite coloration efficiencies by two to three times. ProDOT(CH$_2$OCH$_2$C(CH$_3$)(CH$_2$OC(O)C$_5$H$_{11}$)$_2$)$_2$ also has a high coloration efficiency even though the switching time is much slower. The contrast ratio is lower, typically seen when the π-π* is broad. All films could be switched over 20 times without substantial loss of electroactivity and contrast between states.

TABLE 4

Electrochromic properties of ester and alcohol substituted PProDOTs.

| | % ΔT | t(s) | CE |
|---|---|---|---|
| PProDOT(CH$_2$C(O)OC$_6$H$_{13}$)$_2$ | 63 | 0.8 | 660 |
| PProDOT(CH$_2$OH)$_2$ | 57 | 0.9 | 396 |
| PProDOT(CH$_2$OCH$_2$C(CH$_3$)(CH$_2$OC(O)C$_5$H$_{11}$)$_2$)$_2$ | 48 | 3.6 | 703 |

Example 15

Figure 11:
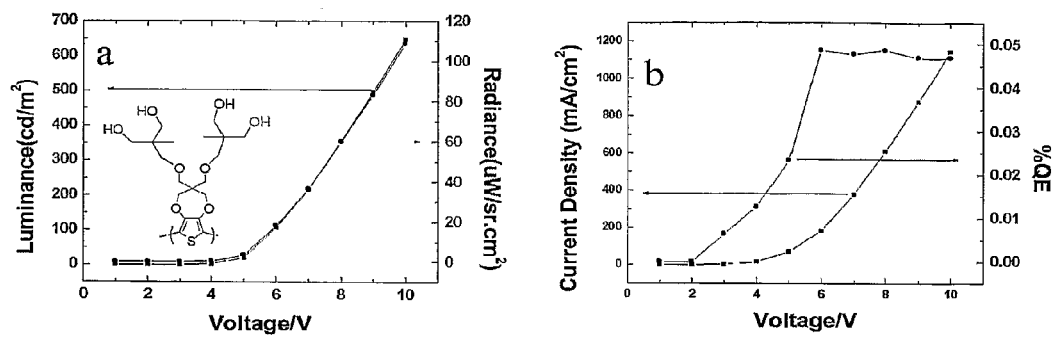
FIG. 11 shows the characterization of an ITO/PProDOT(CH$_2$OCH$_2$C(CH$_3$)(CH$_2$OH)$_2$)$_2$/MEH-PPV/Ca/Al device by luminance, current density and percent quantum efficiency vs voltage.

The alcohol substituted PProDOTs were studied as hole transport layers in light emitting diodes with MEH-PPV as the emitting polymer. First, the ester substituted PProDOTs were spin-cast on ITO coated glass slides followed by defunctionalization with KOH in methanol, washed with methanol, and vacuum dried for two hours at 55° C. Then the emitting polymer, MEH-PPV, was spin cast on top of the insoluble alcohol substituted PProDOT film and the devices were characterized, as shown in FIG. 11. An external quantum efficiency of 0.05% was achieved for thin films of PProDOT (CH$_2$OCH$_2$C(CH$_3$)(CH$_2$OH)$_2$)$_2$ at 6V where the current flow is 180 mA/cm$^2$. Luminance was found to increase with increasing voltage and reached a maximum value of 650 cd/m$^2$ at 10V. These initial results show that PProDOT (CH$_2$OCH$_2$C(CH$_3$)(CH$_2$OH)$_2$)$_2$ can be a potential candidate as a hole transport layer in PLEDs. All three alcohol substituted PProDOTs were tested in this manner and compared to PEDOT-PSS. All devices gave similar values with luminance reaching maximum values of 30-40 cd/m$^2$ and external quantum efficiencies of 0.3%. This provides proof of concept that these films can be used as hole transport layers in polymer light emitting diodes and they have been shown to work as well as PEDOT-PSS by direct comparison.

Example 16

Figure 12:
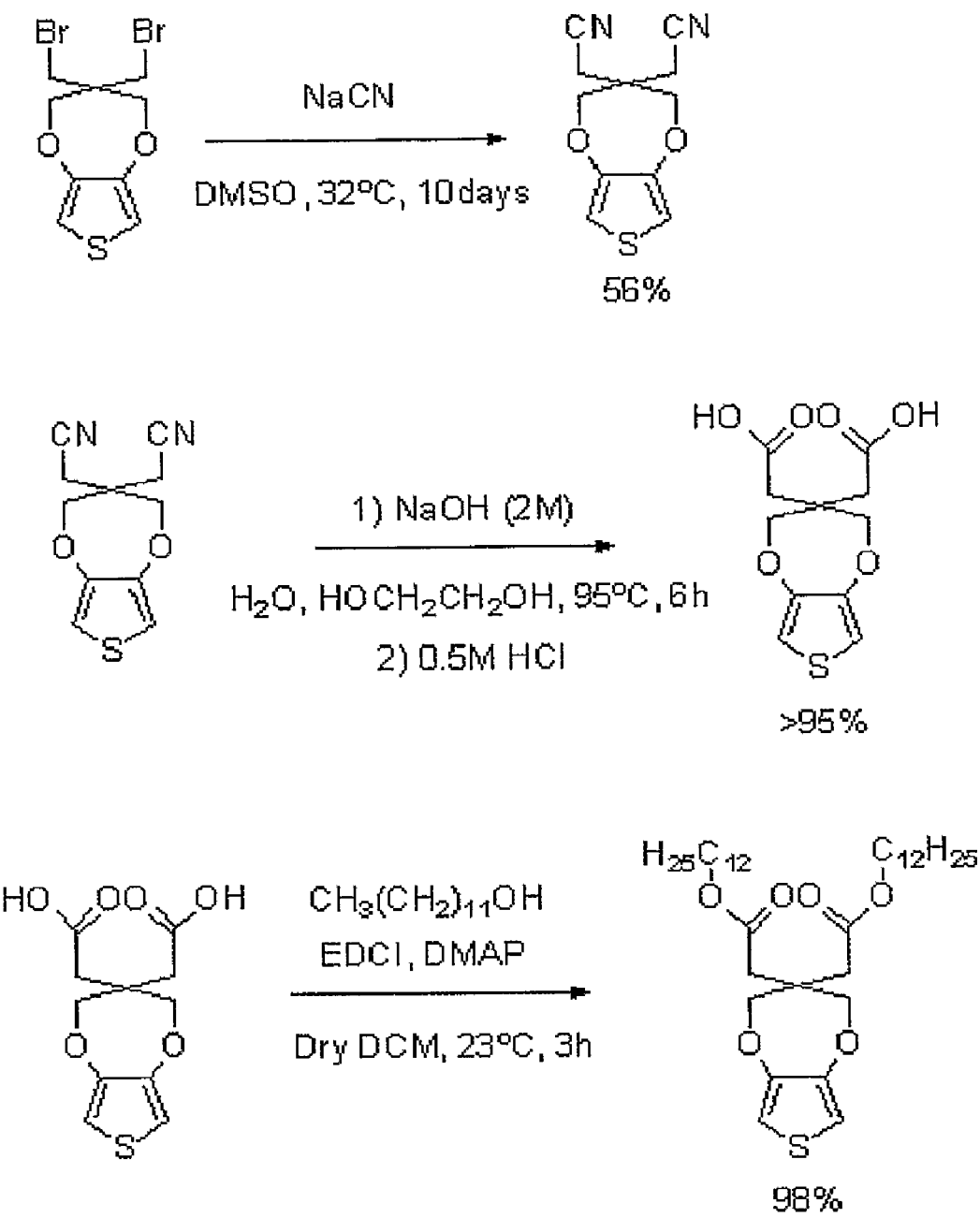
FIG. 12 shows the synthesis of ProDOT(CH$_2$CO$_2$C$_{12}$H$_{25}$)$_2$.

The synthesis of 3,3-Bis(2,2-methylene(dodecyl-carboxylate))-3,4-dihydro-2H-thieno[3,4-b][1,4]-dioxepine [ProDOT(CH$_2$CO$_2$C$_{12}$H$_{25}$)$_2$] was carried out in three steps form 3,3-Bis(bromomethyl)-3,4-dihydro-2H-thieno[3,4-b][1,4] dioxepine (ProDOT(CH$_2$Br)$_2$) as illustrated in FIG. 12.

In the first step, ProDOT(CH$_2$Br)$_2$ (6 g, 17.5 mmol) and Sodium Cyanide (2.6 g, 52.6 mmol) were charged into a 250 mL 3-necked flask equipped with a condenser under Argon atmosphere. Anhydrous DMF (50 mL) was then cannula transferred to the flask and the mixture was stirred at 115° C. for 24 h. After cooling to room temperature, the reaction mixture was poured into water (200 mL) and extracted three times with dichloromethane (3×80 mL), the organic phase was washed with water three times (3×50 mL) and dried over Mg$_2$SO$_4$. Dichloromethane was removed by rotary evaporation and the resulting yellow oil was charged in a normal phase silica chromatography column employing dichloromethane/petroleum ether (4:0.5) as eluent. After removal of the solvent, the product 3,3-Bis(cyanomethyl)-3,4-dihydro-2H-thieno[3,4-b][1,4]-dioxepine ProDOT(CH$_2$CN)$_2$ was redissolved in ethanol and obtained as a white crystalline solid after a rotary evaporation of the eluent mixture in 56 percent yield.

In the second step, ProDOT(CH$_2$CN)$_2$ (50 mg, 0.183 mmol) was charged into a 250 mL 3-necked flask equipped with a condenser. A solution of sodium hydroxide (2M in Water/Ethylene Glycol (1:1)) was poured into the flask and the mixture was stirred at 107° C. for 12 hours. After cooling to room temperature, a solution of HCl (0.5M in Water) was used to set the mixture to a pH~3-4. The mixture was then extracted three times with ether (3×40 mL), the organic phase was washed with water three times (3×30 mL) and dried over $Mg_2SO_4$. Ether was removed by rotary evaporation and the resulting yellow oil was charged in a normal phase silica chromatography column employing pure ethyl acetate as the eluent. After removal of ethyl acetate the product ProDOT $(CH_2CO_2H)_2$ is isolated as solid.

The ProDOT$(CH_2CO_2C_{12}H_{25})_2$ was formed by the condensation of ProDOT$(CH_2CO_2H)_2$ (0.500 g 1.78 mmol) with 1-dodecanol (1.37 g, 7.35 mmole) using 1-ethyl-3-(3'dimethylaminopropyl)carbodiimide (2.1 g) and dimethylaminopyridine (1.34 g) in dry dichloromethane (50 mL) at room temperature for 3 hours. The product ProDOT $(CH_2CO_2C_{12}H_{25})_2$ was isolated by normal phase silica chromatography by eluting with hexane/ethylacetate (6:1) to recover ProDOT$(CH_2CO_2C_{12}H_{25})_2$ in 98 percent yield (1.1 g, 1.74 mmole).

Example 17

Figure 13:
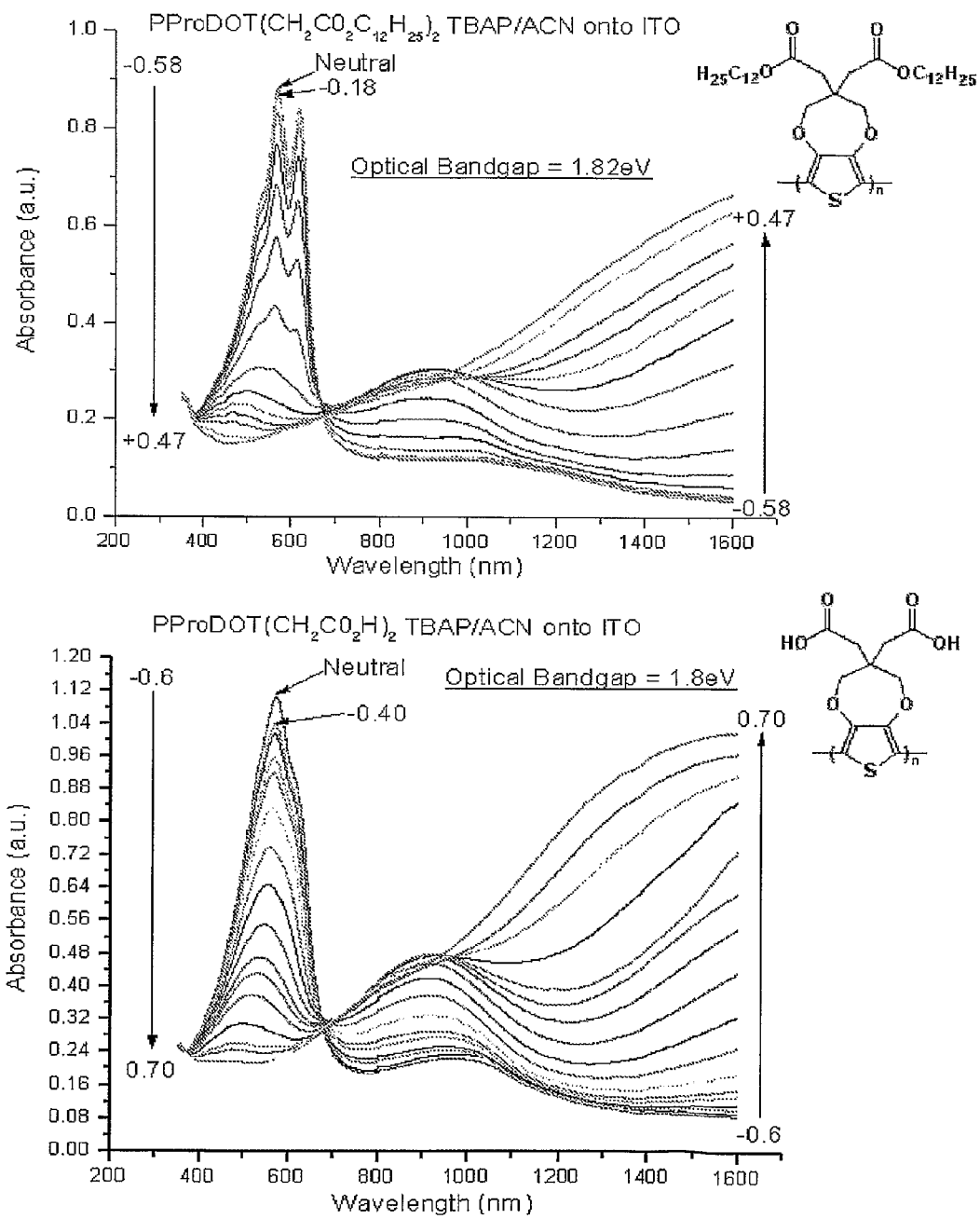
FIG. 13 shows the characterization of PProDOT(CH$_2$CO$_2$C$_{12}$H$_{25}$)$_2$ (top) and PProDOT(CH$_2$CO$_2$H)$_2$ (bottom) spectroelectrochemically at various potentials vs Fc/Fc$^+$.

Spectroelectrochemistry was performed, as seen in FIG. 13, on electrochemically polymerized ProDOT $(CH_2CO_2C_{12}H_{25})_2$ and ProDOT$(CH_2CO_2H)_2$ to yield films of PProDOT$(CH_2CO_2C_{12}H_{25})_2$ and PProDOT$(CH_2CO_2H)_2$, respectively. Little difference is observed between the two polymers. The neutral polymers both have band-gaps of 1.8 eV with $\lambda_{max}$ of about 572 nm and similar fine structure with the exception that a second maximum for the neutral PProDOT$(CH_2CO_2C_{12}H_{25})_2$ at about 620 nm is observed as a weak shoulder in the spectrum of the neutral PProDOT $(CH_2CO_2H)_2$.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

The invention claimed is:

1. A method for preparing a defunctionalized alkylenedioxyheterocycle polymer or copolymer comprising the steps of: providing a polycarboxylic acid derivative functionalized alkylenedioxyheterocycle polymer or copolymer with a degree of polymerization from 10 to 1,000, the fraction of polycarboxylic acid derivative functionalized alkylenedioxyheterocycle units is 0.1 to 1.0, and wherein one or more optional co-repeating units are derived from monomers selected from the group consisting of thiophene, bithiophene, terthiophene, 3-methylthiophene, 3-alkylthiophene (alkyl=C2 to C20), 3-methoxythiophene, 3-alkoxythiophene (alkoxy=C2 to C20), 3,4-ethylenedioxythiophene, 3,4-propylenedioxythiophene, 3,4-butylenedioxythiophene, pyrrole, bipyrrole, 3-methylpyrrole, 3-alkylpyrrole (alkyl=C2 to C20), 3-methoxypyrrole, 3-alkoxypyrrole (alkoxy=C2 to C20), 3,4-ethylenedioxypyrrole, 3,4-propylenedioxqpyrrole, 3,4-butylenedioxypyrrole, N-methylpyrrole, N-alkylpyrrole (alkyl=C2 to C20), N-methyl-3,4-ethylenedioxypyrrole, N-alkyl-3,4-ethylenedioxypyrrole (alkyl=C2 to C20), N-methyl-3,4-propylenedioxypyrrole, N-alkyl-3,4-propylenedioxypyrrole (alkyl=C2 to C20), carbazole, N-methylcarbazole, and N-alkylcarbazole (alkyl=C2 to C20); and
transforming the polycarboxylic acid derivative functionalized alkylenedioxyheterocycle polymer or copolymer into a defunctionalized alkylenedioxyheterocycle polymer or copolymer comprising a polyhydroxy, polythiol, polyamino, or polycarboxylic acid functionalized alkylenedioxyheterocycle polymer or copolymer with a degree of polymerization from 10 to 1,000, the fraction of polycarboxylic acid derivative functionalized alkylenedioxyheterocycle units is 0.1 to 1.0, and wherein one or more optional co-repeating units are derived from the monomers selected from the group consisting of thiophene, bithiophene, terthiophene, 3-methylthiophene, 3-alkylthiophene (alkyl=C2 to C20), 3-methoxythiophene, 3-alkoxythiophene (alkoxy=C2 to C20), 3,4-ethylenedioxythiophene, 3,4-propylenedioxythiophene, 3,4-butylenedioxythiophene, pyrrole, bipyrrole, 3-methylpyrrole, 3-alkylpyrrole (alkyl=C2 to C20), 3-methoxypynole, 3-alkoxypyrrole (alkoxy=C2 to C20), 3,4-ethylenedioxypyrrole, 3,4-propylenedioxypynole, 3,4-butylenedioxypyrrole, N-methylpyrrole, N-alkylpyrrole (alkyl=C2 to C20), N-methyl-3,4-ethylenedioxypyrrole, N-alkyl-3,4-ethylenedioxypyrrole (alkyl=C2 to C20), N-methyl-3,4-propylenedioxypyrrole, N-alkyl-3,4-propylenedioxypyrrole (alkyl=C2 to C20), carbazole, N-methylcarbazole, and N-alkylcarbazole (alkyl=C2 to C20).

2. The method of claim 1, wherein the polycarboxylic acid derivative functionalized alkylenedioxyheterocycle repeating units of the polymer or copolymer comprises:

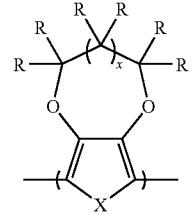

wherein x is 0 to 3; X is S, O, or NR'''; and R is independently H, —$(CH_2)_m$—YC(O)R', —$(CH_2)_m$—C(O)YR', —$(CH_2)_m$—O—$(CH_2)_v$YC(O)R', —$(CH_2)_m$—O—$(CH_2)_v$C(O)YR', —$(CH_2)_m$—OCH$_z$(CH$_3$)$_y$[(CH$_2$)$_w$YC(O)R']$_{3-y-z}$, or —$(CH_2)_m$—OCH$_z$(CH$_3$)$_y$[(CH$_2$)$_w$C(O)YR']$_{3-y-z}$ where at least two R groups are —$(CH_2)_m$—YC(O)R', —$(CH_2)_m$—C(O)YR', —$(CH_2)_m$—O—$(CH_2)_v$YC(O)R', —$(CH_2)_m$—O—$(CH_2)$C(O)YR', —$(CH_2)_m$—OCH$_z$(CH$_3$)$_y$[(CH$_2$)$_w$YC(O)R']$_{3-y-z}$, or —$(CH_2)_m$—OCH$_z$(CH$_3$)$_y$[(CH$_2$)$_w$C(O)YR']$_{3-y-z}$; m is 1 to 8; y is 0 to 2; z is 0 to 2; y+z is 0 to 2; w is 1 to 8; v is 2 to 8; Y is O, S, or NR'', R' is a straight chained, branched chain, cyclic or substituted cyclic alkyl group of 1 to 12 carbons, R'' is a straight chained, branched chain, cyclic or substituted cyclic alkyl group of 1 to 6 carbons, and R''' is H, straight chained, branched chain, cyclic or substituted cyclic alkyl group of 1 to 12 carbons, aryl, benzyl, alkylaryl, CH$_2$C(O)OR'''', or CH$_2$OC(O)R'''' where R'''' is H, straight chained, branched chain, cyclic or substituted cyclic alkyl group of 1 to 12 carbons, aryl, benzyl, or alkylaryl.

3. The method of claim 1, wherein the polycarboxylic acid derivative functionalized alkylenedioxyheterocycle repeating units of the polymer or copolymer comprises:

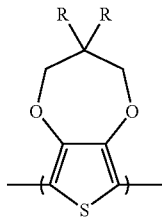

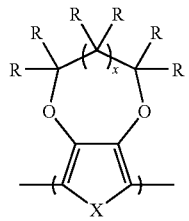

wherein R is $(CH_2)_m$—YC(O)R', —$(CH_2)_m$—C(O)YR', —$(CH_2)_m$—O—$(CH_2)_v$YC(O)R', —$(CH_2)_m$—O—$(CH_2)_v$C(O)YR', —$(CH_2)_m$—OCH$_z$(CH$_3$)$_y$[(CH$_2$)$_w$YC(O)R']$_{3-y-z}$, or —$(CH_2)_m$—OCH$_z$(CH$_3$)$_y$[(CH$_2$)$_w$C(O)YR']$_{3-y-z}$; m is 1 to 8; y is 1 to 2; z is 0 to 2; y+z is 1 to 2; w is 1 to 8; v is 2 to 8; Y is O, S, or NR", R' is a straight chained, branched chain, cyclic or substituted cyclic alkyl group of 1 to 12 carbons and R" is a straight chained, branched chain, cyclic or substituted cyclic alkyl group of 1 to 6 carbons.

4. The method of claim 1, wherein the polycarboxylic acid derivative functionalized alkylenedioxyheterocycle polymer or copolymer is provided in a solvent.

5. The method of claim 4, wherein the solvent comprises at least one solvent selected from the group consisting of chloroform, methylene chloride, ethyl acetate, toluene, and tetrahydrofuran.

6. The method of claim 4, further comprising a step of removing the solvent.

7. The method of claim 6, wherein the removing is carried out at a temperature of less than or equal to 100° C.

8. The method of claim 6, wherein the removing is carried out at a pressure of one atmosphere or less.

9. The method of claim 1, wherein the transforming reaction occurs thermally, photochemically, or by the addition of a cleaving reagent.

10. The method of claim 9, wherein the cleaving reagent is water or an alcohol.

11. The method of claim 9, wherein a catalyst is included to promote the transforming reaction.

12. The method of claim 11, wherein the catalyst is an alkali metal hydroxide.

13. The method of claim 9, wherein the cleaving reagent is introduced in a second solvent that does not dissolve the polycarboxylic acid derivative functionalized alkylenedioxyheterocycle polymer or copolymer.

14. The method of claim 13, wherein the second solvent is water, methanol or ethanol.

15. The method of claim 1, wherein the defunctionalized alkylenedioxyheterocycle polymer or copolymer is subsequently extracted with a solvent.

16. The method of claim 1, wherein the polyhydroxy, polythiol, polyamino, or polycarboxylic acid functionalized alkylenedioxyheterocycle polymer or copolymer is subsequently heated to a second temperature at a second pressure to substantially remove impurities resulting from the cleaving step.

17. The method of claim 16, wherein the second temperature is less than or equal to 100° C.

18. The method of claim 16, wherein the second pressure is less than or equal to 1 atmosphere.

19. The method of claim 1, wherein the defunctionalized alkylenedioxyheterocycle repeating units comprises:

wherein x is 0 to 3; X is S, O, or NR'''; and R is independently H, —$(CH_2)_m$—Z, —$(CH_2)_m$—O—$(CH_2)_v$Z, or —$(CH_2)_m$—OCH$_z$[(CH$_2$)$_w$Z]$_{3-z}$ where at least two R groups are —$(CH_2)_m$—Z, —$(CH_2)_m$—O—$(CH_2)_v$Z, or —$(CH_2)_m$—OCH$_z$(CH$_3$)$_y$[(CH$_2$)$_w$Z]$_{3-y-z}$; m is 1 to 8; y is 0 to 2; z is 0 to 2; y+z is 0 to 2; w is 1 to 8; v is 2 to 8, and Z is OH, NHR', SH, or C(O)OH; and R''' is H, straight, chained, branched chain, cyclic or substituted cyclic alkyl group of 1 to 12 carbons, aryl, benzyl, alkylaryl, CH$_2$C(O)OR'''', or CH$_2$OC(O)R'''' where R'''' is H, straight chained, branched chain, cyclic or substituted cyclic alkyl group of 1 to 12 carbons, aryl, benzyl, or alkylaryl.

20. The method of claim 1, wherein the defunctionalized alkylenedioxyheterocycle repeating units comprises:

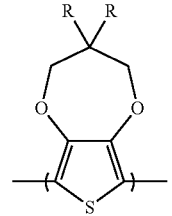

wherein R is —$(CH_2)_m$—Z, —$(CH_2)_m$—O—$(CH_2)_v$Z, or m is 1 to 8; v is 2 to 8, and Z is OH, NHR', SH, or C(O)OH.

21. A polycarboxylic acid derivative functionalized alkylenedioxyheterocycle polymer or copolymer comprising singularly or in combination polycarboxylic acid derivative functionalized alkylenedioxyheterocycle repeating units of the structure:

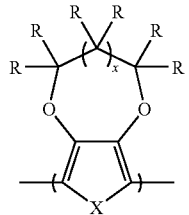

wherein x is 0 to 3; X is S, O, or NR'''; and R is independently H, —$(CH_2)_m$—YC(O)R', —$(CH_2)_m$—C(O)YR', —$(CH_2)_m$—O—$(CH_2)_v$YC(O)R', —$(CH_2)$—O—$(CH_2)_v$C(O)YR', —$(CH_2)_m$—OCH$_z$(CH$_3$)$_y$[(CH$_2$)$_w$YC(O)R']$_{3-y-z}$, or —$(CH_2)_m$—OCH$_z$(CH$_3$)$_y$[(CH$_2$)$_w$C(O)YR']$_{3-y-z}$ where at least two R groups are —$(CH_2)_m$—YC(O)R', —$(CH_2)_m$—C(O)YR', —$(CH_2)_m$—O—$(CH_2)_v$YC(O)R', —$(CH_2)$—O—$(CH_2)_v$C(O)YR', —$(CH_2)_m$—OCH$_z$(CH$_3$)$_y$[(CH$_2$)$_w$YC(O)R']$_{3-y-z}$, or —$(CH_2)_m$—OCH$_z$(CH$_3$)$_y$[(CH$_2$)$_w$C(O)YR']$_{3-y-z}$; m is 1 to 8; y is 0 to 2; z is 0 to 2; w is 1 to 8; v is 2 to 8; Y is O, S, or NR", R' is a straight chained, branched chain, cyclic or substituted cyclic alkyl group of 1 to 12 carbons, R" is a straight chained, branched chain, cyclic or substituted cyclic alkyl group of 1 to 6 carbons, and R''' is H, straight chained, branched chain, cyclic or substituted cyclic alkyl group of 1 to 12 carbons, aryl, benzyl, alkylaryl, CH$_2$C(O)OR'''', or CH$_2$OC(O)R'''' where R'''' is H, straight chained, branched chain, cyclic or substituted cyclic alkyl group of 1 to 12 carbons, aryl, benzyl, or alkylaryl; and optionally one or more heterocyclic repeating units derived from the monomers selected from the group consisting of thiophene, bithiophene, terthiophene, 3-methylthiophene, 3-alkylthiophene (alkyl=C2 to C20), 3-methoxythiophene, 3-alkoxythiophene (alkoxy=C2 to C20), 3,4-ethylenedioxythiophene, 3,4-propylenedioxythiophene, 3,4-butylenedioxythiophene, pyrrole, bipyrrole, 3-methylpyrrole, 3-alkylpyrrole (alkyl=C2 to C20), 3-methoxypyrrole, 3-alkoxypyrrole(alkoxy=C2 to C20), 3,4-ethylenedioxypyrrole, 3,4-propylenedioxypyrrole, 3,4-butylenedioxypyrrole, N-methylpyrrole, N-alkylpyrrole (alkyl=C2 to C20), N-methyl-3,4-ethylenedioxypyrrole, N-alkyl-3,4-ethylenedioxypyrrole (alkyl=C2 to C20), N-methyl-3,4-propylenedioxypyrrole, N-alkyl-3,4-propylenedioxypyrrole (alkyl=C2 to C20), carbazole, N-methylcarbazole, and N-alkylcarbazole (alkyl=C2 to C20), wherein the degree of polymerization of the copolymer is 10 to 1,000 and the fraction of polycarboxylic acid derivative functionalized alkylenedioxyheterocycle repeating units is 0.1 to 1.0.

22. The polycarboxylic acid derivative functionalized poly(alkylenedioxyheterocycle) of claim 21, wherein the polycarboxylic acid derivative functionalized poly(alkylenedioxyheterocycle) comprises

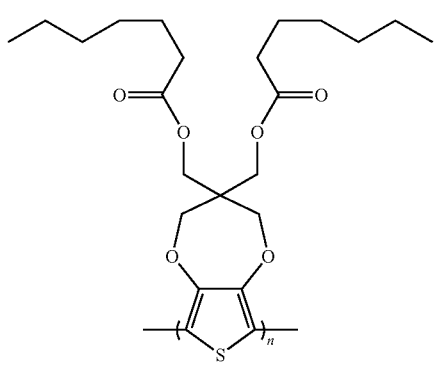

wherein n is 10 to 1,000.

23. The polycarboxylic acid derivative functionalized poly(alkylenedioxyheterocycle) of claim 21, wherein the polycarboxylic acid derivative functionalized poly(alkylenedioxyheterocycle) comprises

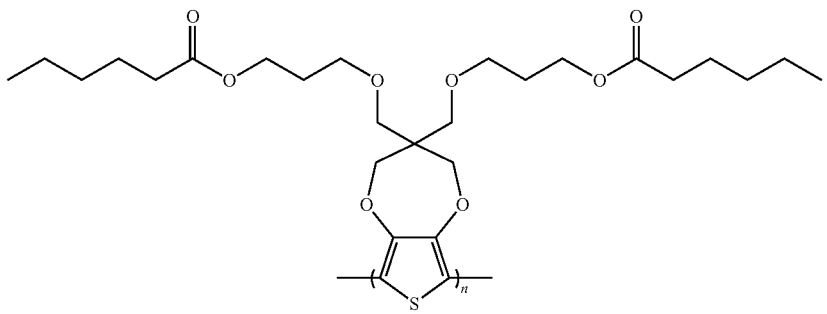

wherein n is 10 to 1,000.

24. The polycarboxylic acid derivative functionalized poly(alkylenedioxyheterocycle) of claim 21, wherein said polycarboxylic acid derivative functionalized poly(alkylenedioxyheterocycle) comprises

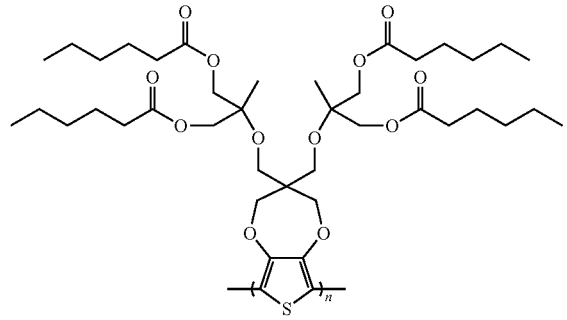

wherein n is 10 to 1,000.

25. The polycarboxylic acid derivative functionalized poly(alkylenedioxyheterocycle) of claim 21, wherein said polycarboxylic acid derivative functionalized poly(alkylenedioxyheterocycle) comprises

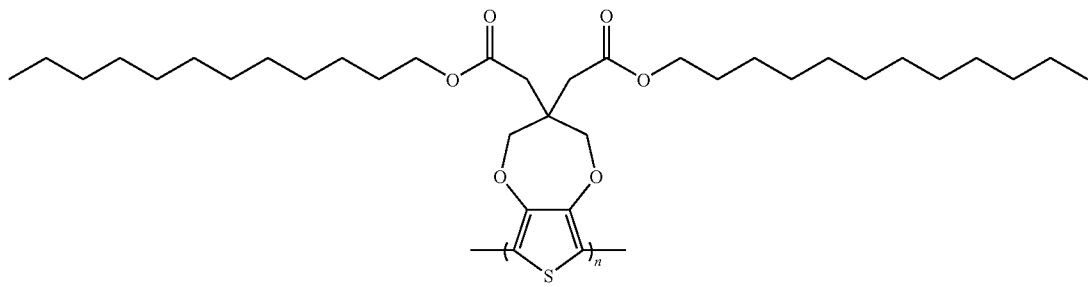

wherein n is 10 to 1,000.

26. A polyhydroxy, polythiol, polyamino, or polycarboxylic acid functionalized alkylenedioxyheterocycle polymer or copolymer comprising singularly or in combination polyhydroxy, polythiol, polyamino, or polycarboxylic acid functionalized alkylenedioxyheterocycle repeating units of the structure:

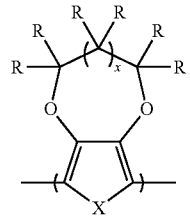

wherein x is 0 to 3; X is S, O, or NR'''; and R is independently H, —$(CH_2)_m$—Z, —$(CH_2)_m$—O—$(CH_2)_v$Z, or —$(CH_2)_m$—$OCH_z[(CH_2)_wZ]_{3-z}$ where at least two R groups are —$(CH_2)_m$—Z, —$(CH_2)_m$—O—$(CH_2)_v$Z, or —$(CH_2)_m$—$OCH_z(CH_3)_y[(CH_2)_wZ]_{3-y-z}$; m is 1 to 8; y is 0 to 2; z is 0 to 2; y+z is 0 to 2; w is 1 to 8; v is 2 to 8, and Z is OH, $NHR^1$, SH, or C(O)OH; and R''' is H, straight chained, branched chain, cyclic or substituted cyclic alkyl group of 1 to 12 carbons, aryl, benzyl, alkylaryl, $CH_2C(O)OH$ or $CH_2OH$ and one or more heterocyclic repeating units derived from the monomers selected from the group consisting of thiophene, bithiophene, terthiophene, 3-methylthiophene, 3-alkylthiophene (alkyl=C2 to C20), 3-methoxythiophene, 3-alkoxythiophene (alkoxy=C2 to C20), 3,4-ethylenedioxythiophene, 3,4-propylenedioxythiophene, 3,4-butylenedioxythiophene, pyrrole, bipyrrole, 3-methylpyrrole, 3-alkylpyrrole (alkyl=C2 to C20), 3-methoxypyrrole, 3-alkoxypyrrole (alkoxy=C2 to C20), 3,4-ethylenedioxypyrrole, 3,4-propylenedioxypyrrole, 3,4-butylenedioxypyrrole, N-methylpyrrole, N-alkylpyrrole (alkyl=C2 to C20), N-methyl-3,4-ethylenedioxypyrrole, N-alkyl-3,4-ethylenedioxypyrrole (alkyl=C2 to C20), N-methyl-3,4-propylenedioxypyrrole, N-alkyl-3,4-propylenedioxypyrrole (alkyl=C2 to C20), carbazole, N-methylcarbazole, and N-alkylcarbazole (alkyl=C2 to C20), wherein the degree of polymerization of the copolymer is 10 to 1,000 and the fraction of polycarboxylic acid derivative functionalized-alkylenedioxyheterocycle repeating units is 0.1 to 1.0.

27. The functionalized alkylenedioxyheterocycle polymer of claim 26, wherein said polyhydroxy, polythiol, polyamino, or polycarboxylic acid functionalized poly(alkylenedioxyheterocycle) comprises

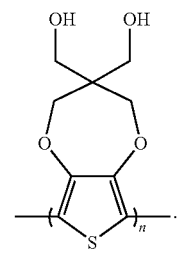

wherein n is 10 to 1,000.

28. The functionalized alkylenedioxyheterocycle polymer of claim 26, wherein said polyhydroxy, polythiol, polyamino, or polycarboxylic acid functionalized poly(alkylenedioxyheterocycle) comprises

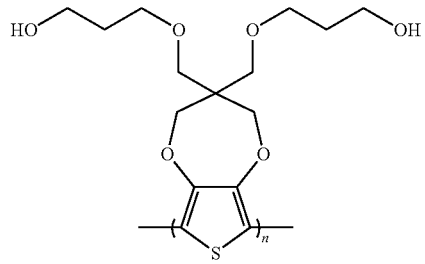

wherein n is 10 to 1,000.

29. The functionalized alkylenedioxyheterocycle polymer of claim 26, wherein said polyhydroxy, polythiol, polyamino, or polycarboxylic acid functionalized poly(alkylenedioxyheterocycle) comprises

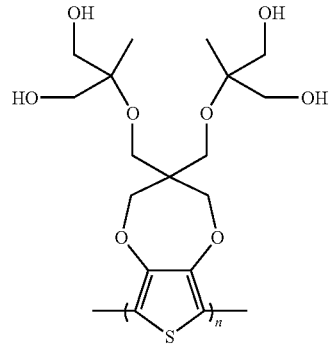

wherein n is 10 to 1,000.

30. The functionalized alkylenedioxyheterocycle polymer of claim 26, wherein said polyhydroxy, polythiol, polyamino, or polycarboxylic acid functionalized poly(alkylenedioxyheterocycle) comprises

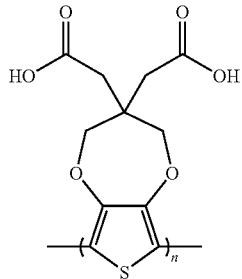

wherein n is 10 to 1,000.

31. A monomer for the preparation of polycarboxylic acid derivative functionalized poly(alkylenedioxyheterocycle) comprising:

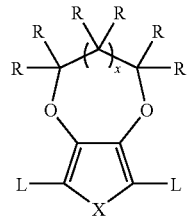

where x is 0 to 3; X is S, O, or NR'''; L is H, I, Br, Cl, OC(O)CF$_3$, or B(OR'''')$_2$ where R'''' is H, methyl, ethyl or the two R'''' groups are combined as terminal ends of an ethylene or propylene unit; and R is independently H, —(CH$_2$)$_m$—YC(O)R', —(CH$_2$)$_m$—C(O)YR', —(CH$_2$)$_m$—O—(CH$_2$)$_v$YC(O)R', —(CH$_2$)$_m$—O—(CH$_2$)$_v$C(O)YR', —(CH$_2$)$_m$—OCH$_z$(CH$_3$)$_y$[(CH$_2$)$_w$YC(O)R']$_{3-y-z}$, or —(CH$_2$)$_m$—OCH$_z$(CH$_3$)$_y$[(CH$_2$)$_w$C(O)YR']$_{3-y-z}$ where at least two R groups are —(CH$_2$)$_m$—YC(O)R', —(CH$_2$)$_m$—C(O)YR', —(CH$_2$)$_m$—O(CH$_2$)$_v$YC(O)R', —(CH$_2$)$_m$—O—(CH$_2$)$_v$C(O)YR', —(CH$_2$)$_m$—OCH$_z$(CH3)$_y$[(CH$_2$)$_w$YC(O)R']$_{3-y-z}$, or —(CH$_2$)$_m$—OCH$_z$(CH$_3$)$_y$[(CH$_2$)$_w$C(O)YR']$_{3-y-z}$; m is 1 to 8; y is 0 to 2; z is 0 to 2; y+z is 0 to 2; w is 1 to 8; v is 2 to 8; Y is O, S, or NR'', R' is a straight chained, branched chain, cyclic or substituted cyclic alkyl group of 1 to 12 carbons, R'' is a straight chained, branched chain, cyclic or substituted cyclic alkyl group of 1 to 6 carbons, and R''' is H, straight chained, branched chain, cyclic or substituted cyclic alkyl group of 1 to 12 carbons, aryl, benzyl, alkylaryl, CH$_2$C(O)OR'''', or CH$_2$OC(O)R'''' where R'''' is H, straight chained, branched chain, cyclic or substituted cyclic alkyl group of 1 to 12 carbons, aryl, benzyl, or alkylaryl.

* * * * *

UNITED STATES PATENT AND TRADEMARK OFFICE
CERTIFICATE OF CORRECTION

PATENT NO.       : 7,807,758 B2
APPLICATION NO.  : 12/158941
DATED            : October 5, 2010
INVENTOR(S)      : John R. Reynolds and Benjamin Dennis Reeves It is certified that error appears in the above-identified patent and that said Letters Patent is hereby corrected as shown below:

Column 2,
Line 22, "A disadvantages" should read --A disadvantage--.
Line 34, "perflourinated" should read --perfluorinated--.

Column 3,
Line 7, "3-allylthiophene" should read --3-alkylthiophene--.

Column 4,
Line 23, "-$(CH_2)_w$YC" should read -- -$(CH_2)_v$YC--.

Column 10,
Line 22, "-$(CH_2)C(O)YR'$," should read -- -$(CH_2)_vC(O)YR'$,--.

Column 11,
Line 56, "that can be use" should read --that can be used--.

Column 13,
Line 9, "$C(O)YR']_3$," should read --$C(O)YR']_{3-z}$,--.
Line 38, "-$(CH_2)_m$-OH, or" should read -- -$(CH_2)_v$OH, or--.

Column 14,
Line 5, "$OCH_2$" should read --$OCH_z$--.

Column 15,
Line 63, "the IV" should read --the UV--.

Column 19,
Line 15, "$C_6H_{12})_2$" should read --$C_6H_{13})_2$--.

Signed and Sealed this
Eleventh Day of January, 2011

David J. Kappos
*Director of the United States Patent and Trademark Office*

Column 20,
Line 43, "in three steps form" should read --in three steps from--.

Column 22,
Line 16, "3-methoxypynole," should read --3-methoxypyrrole,--.
Lines 18-19, "3,4-propylenedioxypynole," should read --3,4-propylenedioxypyrrole,--.
Line 50, "(CH$_2$)C(O)YR'," should read --(CH$_2$)$_v$C(O)YR',--.

Column 23,
Line 17, "y is 1 to 2; z is 0 to 2; y+z is 1 to 2" should read --y is 0 to 2; z is 0 to 2; y+z is 0 to 2--.

Column 24,
Line 57, "-(CH$_2$)$_m$" should read -- ~(CH$_2$)$_m$--.
Line 62, "-(CH$_2$)-O-" should read -- -(CH$_2$)$_m$-O- --.
Line 65, "z is 0 to 2; w is" should read --z is 0 to 2; y+z is 0 to 2; w is--.

Column 27,
Line 62, "functionalized-" should read --functionalized--.